United States Patent [19]
Lemon et al.

[11] Patent Number: 5,953,690
[45] Date of Patent: Sep. 14, 1999

[54] INTELLIGENT FIBEROPTIC RECEIVERS AND METHOD OF OPERATING AND MANUFACTURING THE SAME

[75] Inventors: Leon M. Lemon; William I. Fletcher, both of Mendon; Jeffrey V. King, Logan; Steven L. Farnes, Nibley; Terrell S. Fletcher, Mendon, all of Utah

[73] Assignee: Pacific Fiberoptics, Inc., Santa Clara, Calif.

[21] Appl. No.: 08/673,903

[22] Filed: Jul. 1, 1996

[51] Int. Cl.⁶ .................................................... H01J 40/14
[52] U.S. Cl. .......................... 702/191; 702/193; 359/189; 372/38; 250/214 C
[58] Field of Search .................. 364/571.01; 250/214 A, 250/214 C, 214 AG, 205; 359/189, 194; 372/38, 34, 26; 702/191, 193

[56] References Cited

U.S. PATENT DOCUMENTS

| | | | |
|---|---|---|---|
| 4,009,385 | 2/1977 | Sell | 250/199 |
| 4,081,670 | 3/1978 | Albanese | 250/199 |
| 4,166,985 | 9/1979 | White et al. | 331/94.5 S |
| 4,292,606 | 9/1981 | Trimmel | 331/7.51 |
| 4,347,610 | 8/1982 | Meuleman | 372/29 |
| 4,355,395 | 10/1982 | Salter et al. | 372/38 |
| 4,369,525 | 1/1983 | Breton et al. | 455/618 |
| 4,443,695 | 4/1984 | Kitamura | 250/205 |
| 4,539,686 | 9/1985 | Bosch et al. | 372/26 |
| 4,577,320 | 3/1986 | Yoshikawa et al. | 379/29 |
| 4,580,044 | 4/1986 | Hongo et al. | 250/205 |
| 4,611,352 | 9/1986 | Fujito et al. | 455/609 |
| 4,663,760 | 5/1987 | Shimada et al. | 372/31 |
| 4,677,632 | 6/1987 | Lisco et al. | 372/38 |
| 4,689,795 | 8/1987 | Yoshimoto et al. | 372/31 |
| 4,698,817 | 10/1987 | Burley | 372/31 |
| 4,733,398 | 3/1988 | Shibagaki et al. | 372/31 |
| 4,878,225 | 10/1989 | Aiba et al. | 372/38 |
| 4,890,288 | 12/1989 | Inuyama et al. | 372/31 |
| 4,903,273 | 2/1990 | Bathe | 372/38 |
| 4,918,681 | 4/1990 | Ikeda | 369/116 |
| 4,928,284 | 5/1990 | Burns | 372/31 |
| 5,019,769 | 5/1991 | Levinson | 372/31 |
| 5,025,447 | 6/1991 | Ohashi | 372/31 |
| 5,286,969 | 2/1994 | Roberts | 250/214 A |
| 5,396,059 | 3/1995 | Yeates | 250/214 C |
| 5,488,621 | 1/1996 | Slawson et al. | 372/31 |

FOREIGN PATENT DOCUMENTS

| | | | |
|---|---|---|---|
| 0 061 034 | 9/1982 | European Pat. Off. | H01S 3/13 |
| 28 47 182 | 5/1980 | Germany | H01S 3/10 |
| 54-102885 | 8/1979 | Japan | H01S 3/096 |
| 55-83280 | 6/1980 | Japan | H01S 3/096 |
| 57-97691 | 6/1982 | Japan | H01S 3/096 |
| 60-145680 | 8/1985 | Japan | H01S 3/096 |
| 61-42182 | 2/1986 | Japan | H01S 3/133 |
| 61-90487 | 5/1986 | Japan | H01S 3/133 |
| 2 025 121 | 1/1980 | United Kingdom | H01S 3/13 |
| 2 045 516 | 10/1980 | United Kingdom | H01S 3/096 |

*Primary Examiner*—Kamini Shah
*Attorney, Agent, or Firm*—Townsend and Townsend and Crew LLP

[57] ABSTRACT

An intelligent fiberoptic receiver (500) and methods of manufacturing and operating the same. During calibration procedures for the receiver, the optical-to-electrical conversion device (avalanche photodiode (501) or PIN photodiode) and its supporting control and monitoring circuits in the receiver module are characterized over a defined operating temperature range. Characteristic data and/or curves defining these operational control and monitoring functions over the range of operating conditions (temperature, power supply) are stored in non-volatile memory (526) such as EEPROM. During operation, an embedded microcontroller (520) together with analog to digital converters (532), digital to analog converters and other associated circuitry, dynamically control the operational parameters of the module based on the current operating conditions (temperature, power supply).

25 Claims, 21 Drawing Sheets

← FIG. 2A

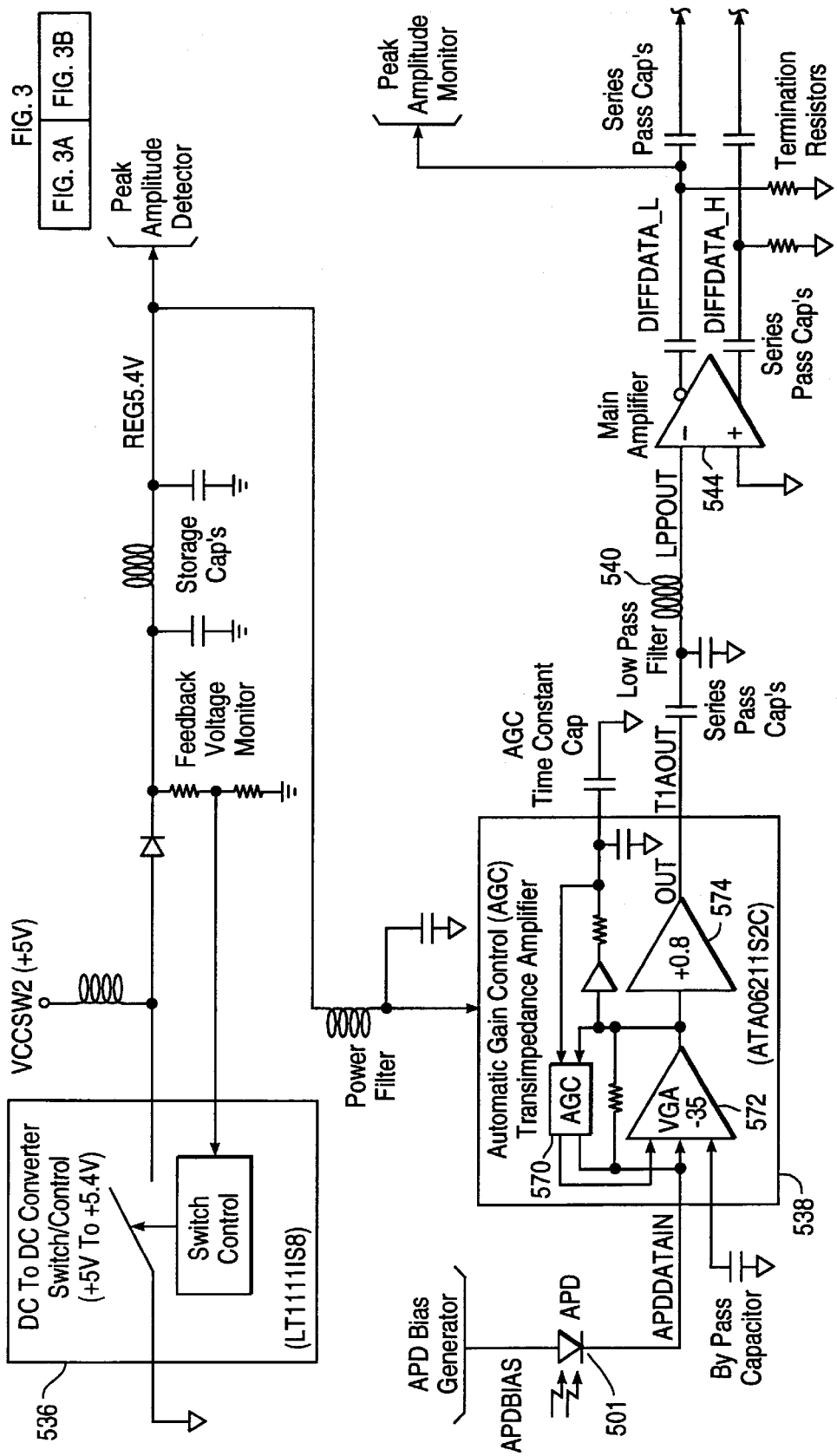

← FIG. 4A

INTELLIGENT FIBEROPTIC RECEIVERS AND METHOD OF OPERATING AND MANUFACTURING THE SAME

FIELD OF THE INVENTION

The present invention relates generally to fiberoptic receivers, and more particularly to intelligent fiberoptic receivers and methods of operating and manufacturing the same.

BACKGROUND OF THE INVENTION

Fiberoptic data transmission systems, such as for voice and data communications, typically employ receivers having some type of optical-to-electrical converter to receive optical pulses from the fiberoptic. An example of such an optical-to-electrical converter is an avalanche photo diode or APD. Typical receivers employing such a photo diode often have a bias control circuit for the photo diode that includes one or more potentiometers in order for the APD bias voltage to be set at a suitable level. As explained more fully herein, APDs typically have gain and noise characteristics that vary depending upon the particular photo diode and the particular bias voltage applied to the APD. Moreover, the characteristics of the APD tend to vary as a function of temperature and with the age of the APD. Still another problem relates to APD and overall receiver performance as a function of power supply variations.

Designers have attempted to address such problems with various bias control and other circuits, typically employing potentiometers or other manual adjustment techniques. The manufacturing and calibration of such receivers, however, tends to be laborious, time consuming and error prone. Additionally, many such receivers tend to operate reliably only in limited temperature ranges, with the result being that undesirable temperature conditions may lead to undesirable error levels or the necessity for expensive temperature control measures or periodic maintenance.

In general, conventional fiberoptic receivers have tended to operate reliably over limited temperature and voltage ranges, while providing limited manual adjustments such as by way of potentiometers and the like. Additionally, such conventional receivers tend to have limited overcurrent protection, and in general do not provide user programmability, except by tedious adjustment of potentiometers and the like.

SUMMARY OF THE INVENTION

The present invention has as an object to overcome limitations of conventional fiberoptic receivers. The present invention utilizes a microcontroller to dynamically monitor and control parameters of the optical-to-electrical conversion device and other components of the receiver module. During calibration procedures for an optical receiver in accordance with the present invention, the optical-to-electrical conversion device (such as APD or PIN photo diode) and its supporting control and monitoring circuits in the receiver module are characterized over a defined operating temperature range and voltage supply range. Characteristic data and/or curves defining these operational control and monitoring functions over the range of operating conditions (e.g., temperature, power supply voltage levels, etc.) are stored in non-volatile memory such as EEPROM. During operation, the embedded microcontroller together with analog-to-digital converters ("ADCs"), digital-to-analog converters ("DACs") and other associated circuitry, dynamically control the operational parameters of the module based on the current operating conditions. Current operating conditions of the receiver module such as temperature and power supply levels are used in preferred embodiments as an indices into the non-volatile memory, which contains operational data tables. The table information is used to adjust the various control parameters.

With fiberoptic receivers in accordance with the present invention, parameters that can be controlled include photo diode bias voltage, main amplifier gain, photo current offset, peak amplitude monitor gain and offset, loss of incoming signal alarm trigger and hysteresis levels. Multi-level, multi-loop, mixed signal (analog and digital) automatic gain control functions operate together in preferred embodiments to extend the input power range of the receiver module as well as to provide over-current protection for the photo diode. The microcontroller also gathers statistical information such as (a) hours of operation, (b) most extreme operating conditions, (c) conditions at time of alarm event, and (d) number of alarm events that have occurred. Such information may be stored in non-volatile memory, and certain information may be provided by way of digital or analog outputs from the receiver module. Using the hours of operation data, for example, the microcontroller also can perform aging factor compensation on necessary control parameters over the life of the module. In addition, a serial interface to the microcontroller provides a powerful programming and monitoring channel for fully automated pre-installation calibration and "in-the-field" monitoring and provide users with the flexibility to monitor and/or change various parameters. The serial interface used in preferred embodiments of the present invention provides a communication channel to program the device during calibration, verification and testing. Such communication channel also provides the flexibility (if the application requires) to monitor and change operational parameters without taking the receiver module off-line. If desired, the control information can be dynamically changed without taking the receiver module off-line.

Accordingly, it is an object of the present invention to provide receiver modules that are suitable for various data and voice communication applications, including what are known as Sonet/SDH transmission systems.

It is another object of the present invention to provide receiver modules that are adaptable to operate reliably and with acceptable error rates over a wide operating temperature range, such as, for example, −40° C. to +85° C., and also over a range of power supply voltages, such as +/−5% of the nominal power supply voltage level.

It is a further object of the present invention to provide a receiver module that consumes a moderate or low amount of power, thereby having applicability in systems in which power consumption is a concern.

It is still another object of the present invention to provide a receiver module utilizing a microcontroller to dynamically monitor and control various components of the receiver module.

It is yet another object of the present invention to provide a receiver module utilizing a microcontroller and non-volatile memory storage of control parameters for the receiver module, with operational conditions such as temperature and power supply voltage used to generate indices for tables stored in the memory.

It is still a further object of the present invention to provide a receiver module that is capable of recording data such as the highest and lowest operational temperatures sensed by the receiver module, highest bias current sensed by the receiver module, and the number of hours of operation for the receiver module, which may be used for MTBF data and APD life data collection.

It is yet a further object to provide an intelligent receiver module utilizing a "potless" design (i.e., no potentiometers), and simplified computer-controlled calibration, verification and testing methods used in the manufacture of such receiver modules, and also methods of operating such receiver modules.

The present invention further provides a receiver module that may have high sensitivity (which may be greater than −33 dBm or more), and extended optical input range (dynamic range) over a range of operating conditions. Preferred embodiments of the present invention also provide a temperature and power supply compensated loss of incoming signal alarm, an internally generated and auto-regulated APD bias voltage, an APD bias voltage adjusted for maximum sensitivity over a range of operating conditions, an auto-regulating APD bias voltage generator and APD overcurrent protection circuits, a multi-level, multi-loop, automatic gain control, a temperature and power supply compensated input power peak amplitude detector, temperature and power supply compensating loss of incoming signal alarm, hardware and software loss of incoming signal hysteresis, and microcontroller controlled and accessed indexing compensation tables using current temperature and power supply levels.

In summary, the present invention provides intelligent, adaptable, programmable receiver modules and methods of manufacturing and operating the same, having advantages, benefits and features not found in conventional receiver modules.

DETAILED DESCRIPTION OF THE PREFERRED EMBODIMENTS

Referring to the attached drawings, various preferred embodiments of the present invention will now be described. It should be noted that in the following discussion various elements are given names for purposes of describing the preferred embodiments of the present invention. It should be understood, however that such descriptive names should not limit the scope of the descriptions only to elements having such names.

Figure 1:
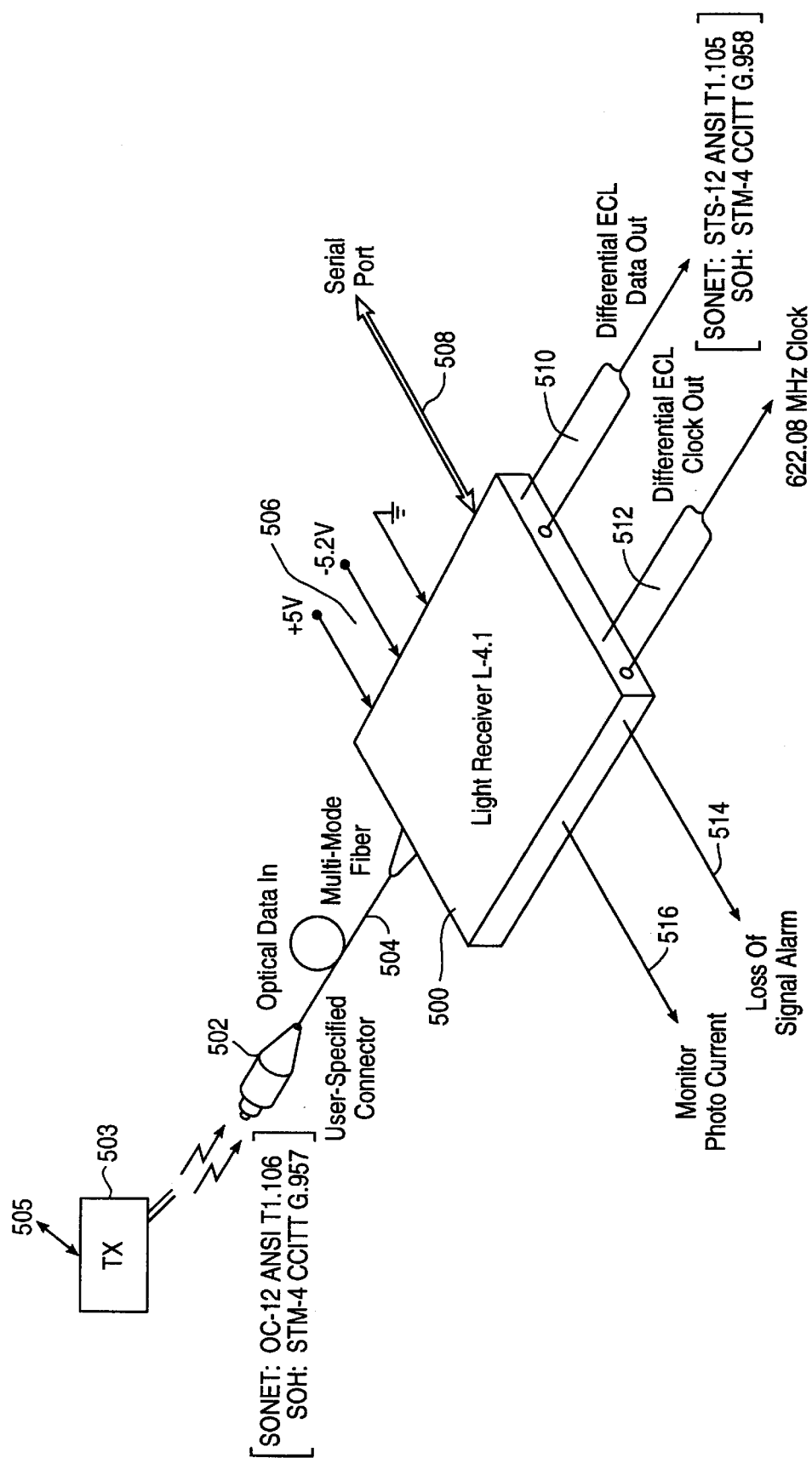
FIG. 1 is an overview diagram illustrating a fiberoptic receiver module in accordance with the present invention.

FIG. 1 is an overview diagram illustrating a fiberoptic receiver module in accordance with the present invention. Fiberoptic connector 502 serves to connect fiberoptic 504 (which may be a single or multi-mode fiber) to a fiberoptic communication network. Fiberoptic 504 delivers optical pulses into receiver module 500. Receiver module 500 includes as inputs power supply/reference voltages 506, and includes as outputs monitor photo current signal 516, loss of signal alarm 514, and clock out signals 512 and data out signals 510, which in the preferred embodiment are differential ECL signals. Fiberoptic receiver modules in accordance with the present invention also include serial communications port 508 for communication with receiver module 500, as more fully described below.

Fiberoptic 504 inputs a stream of optical pulses to receiver module 500 that carries encoded serial digital information received from transmitter 503 over a fiberoptic communication channel, such as a telecommunications network. Transmitter 503 and receiver module 500 each operates in such a telecommunications or other communications network and serves to transmit voice or data communications between points in the network. Such serial digital information is supplied to transmitter 503 such as over port 505, which also may include control channels for operation and control of transmitter 503. In certain preferred embodiments, transmitter 503 is of a type described in application Ser. No. 08/674,059, filed Jul. 1, 1996 "INTELLIGENT FIBEROPTIC TRANSMITTERS AND METHODS OF OPERATING AND MANUFACTURING THE SAME," which is hereby incorporated by reference. In such preferred embodiments, such transmitters and receivers in accordance with the present invention (as more fully described below) may be synchronously controlled, operated and maintained.

The serial digital information received by receiver module 500 is a sequence data bits having a value of either "1" or "0." Typically, a data bit with a value of "1" is represented by a light pulse, and a data bit with a value of "0" is represented as an absence of a light pulse. The bit time of the serial data is the length of time in which one bit of information is transmitted or the length of time that a single optical pulse is either on or off. The bit rate or clock rate for the serial data is the reciprocal of the bit time. The serial data transmitted by the optical pulses over fiberoptic 504 is encoded in a format that allows the serial clock signal to be recovered from the serial data stream. The serial data in a preferred embodiment of the present invention is transmitted in a Pulse Coded Modulation (PCM) format that has been modified by a Pseudo Random Bit Sequence (PRBS) scrambler. The PRBS-scrambled data has the characteristic of having approximately a 50 percent duty cycle, and it minimizes the number of consecutive "0" or "1" pulses that can occur together.

The overall purpose of module 500 is to convert optical pulses coming into module 500 through optical fiber 504 into electrical pulses and an associated bit rate clock signal that are output from module 500 (i.e., data output(s) 510 and clock output(s) 512). Module 500 also outputs error or loss of signal alarm 514 in the preferred embodiment when the received input power drops below a specified level. Module 500 also outputs an analog voltage corresponding to the photocurrent generated by the optical-to-electrical converter, represented by monitor photo current 516 output from module 500. In the preferred embodiment, photo diode 501 (see, e.g., FIG. 2) is used to convert the optical energy into electrical current. The performance of receiver module 500 is measured by several key parameters, including sensitivity, optical overload and dynamic range. The sensitivity of module 500, as used herein, is defined as the minimum power level that can be received before a specified error rate occurs. The optical overload point of module 500 is the maximum power level that can be received by module 500 before a specified error rate occurs. As an example, for Sonet and STM applications, the applicable error level is $1 \times 10^{-10}$ errors. The dynamic range of receiver module 500 is defined as the difference between the optical overload power level and the sensitivity power level.

Without being bound by theory, various principles regarding optical-to-electrical conversions devices. There are two primary types of photo diodes used for optical-to-electrical conversion in embodiments of the present invention; a "P" "Intrinsic" "N" or PIN photo diode, and an avalanche photo diode, or APD, which is used in preferred embodiments of the present invention. Both types of devices convert optical energy into electrical current, but the APD provides an optical gain or multiplication factor in the optical to electrical conversion process. This gain is referred to as the multiplication factor for the optical input at a particular APD bias voltage. An APD also generates noise that varies with the APD bias voltage and the corresponding gain as well as its temperature.

The gain or multiplication factor of the APD is a function of both its bias voltage and temperature. The multiplication factor increases as the bias voltage increases, and it decreases as the temperature increases. For a specific APD bias voltage, the multiplication factor decreases as the APD temperature increases. Accordingly, to maintain the same multiplication factor as the temperature increases, the APD bias voltage must be increased.

The noise generated in the APD also is a function of its bias voltage, temperature and multiplication factor. The noise from the APD's dark current (i.e., current not caused by optical input) increases as the bias voltage increases as well when the APD's temperature increases. The dark current in a PIN photo diode increases only with temperature because a PIN photo diode does not have optical gain. When the multiplication factor of an APD increases, so does the noise from the APD; in other words, the "excess noise factor" of the APD increases as the multiplication factor of the APD increases.

As the bias voltage for an APD is increased the noise from dark current and the excess noise factor also increase. Therefore, there is an optimal bias voltage for an APD which will be referred to as the bias voltage with "Best Signal to Noise Gain". Above this "Best Bias Voltage," as the bias voltage increases the sensitivity is reduced because the noise level increases faster then the signal level. The Best Bias Voltage varies with temperature because the multiplication factor, dark current and excess noise factor of the APD all vary differently with temperature.

If the bias voltage is increased above the Best Bias Voltage, a voltage will be reached where a very small increase in the bias voltage will result in an exponential increase in the output current even when no optical input is present. This bias voltage is referred to as the APD's "Break Down Voltage," and in preferred embodiments of the present invention is used as a reference point in the calibration procedures, as more fully discussed below.

Thus, as provided by embodiments of the present invention, to achieve the maximum sensitivity at a given temperature, the APD bias voltage is set at a level that provides an optimum signal to noise gain, which attempts to optimize signal gain while minimizing the amount of noise generated. As more fully described elsewhere herein, the APD bias voltage to achieve this Best Signal To Noise Gain is determined by a calibration process where the APD is calibrated over its operating range.

While APDs are used in preferred embodiments of the present invention, PIN photo diodes are used in alternative embodiments of the present invention. As will be appreciated by those of skill in the art, embodiments described herein may be modified to incorporate such PIN photo diodes, such as by providing lower voltages for biasing such PIN photo diodes, and accounting in the amplification stages for the lack of gain with PIN photo diodes as compared with APDs.

Figure 2A:
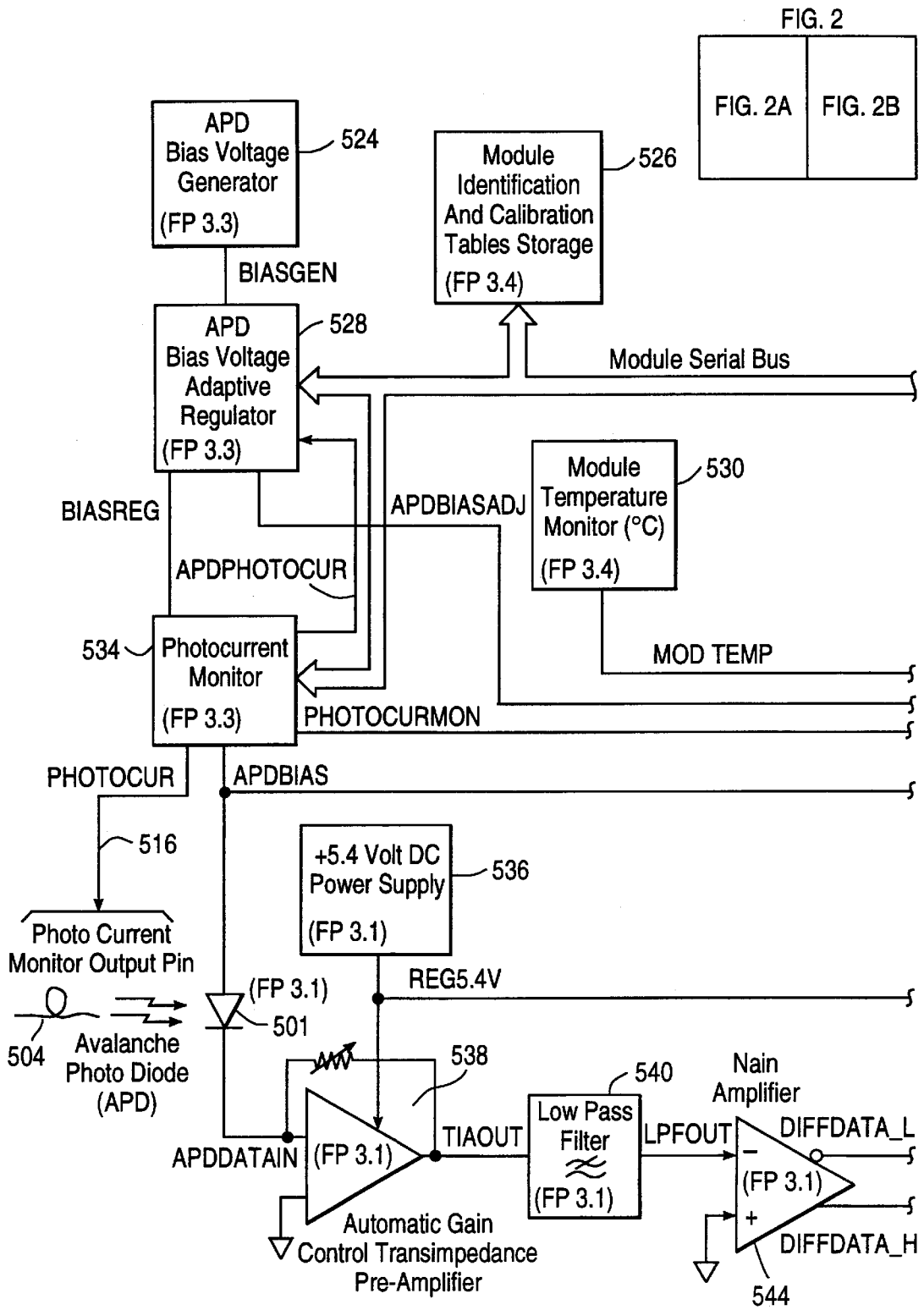
FIG. 2 is a circuit diagram illustrating a preferred embodiment of a fiberoptic receiver module in accordance with the present invention.
Figure 2B:
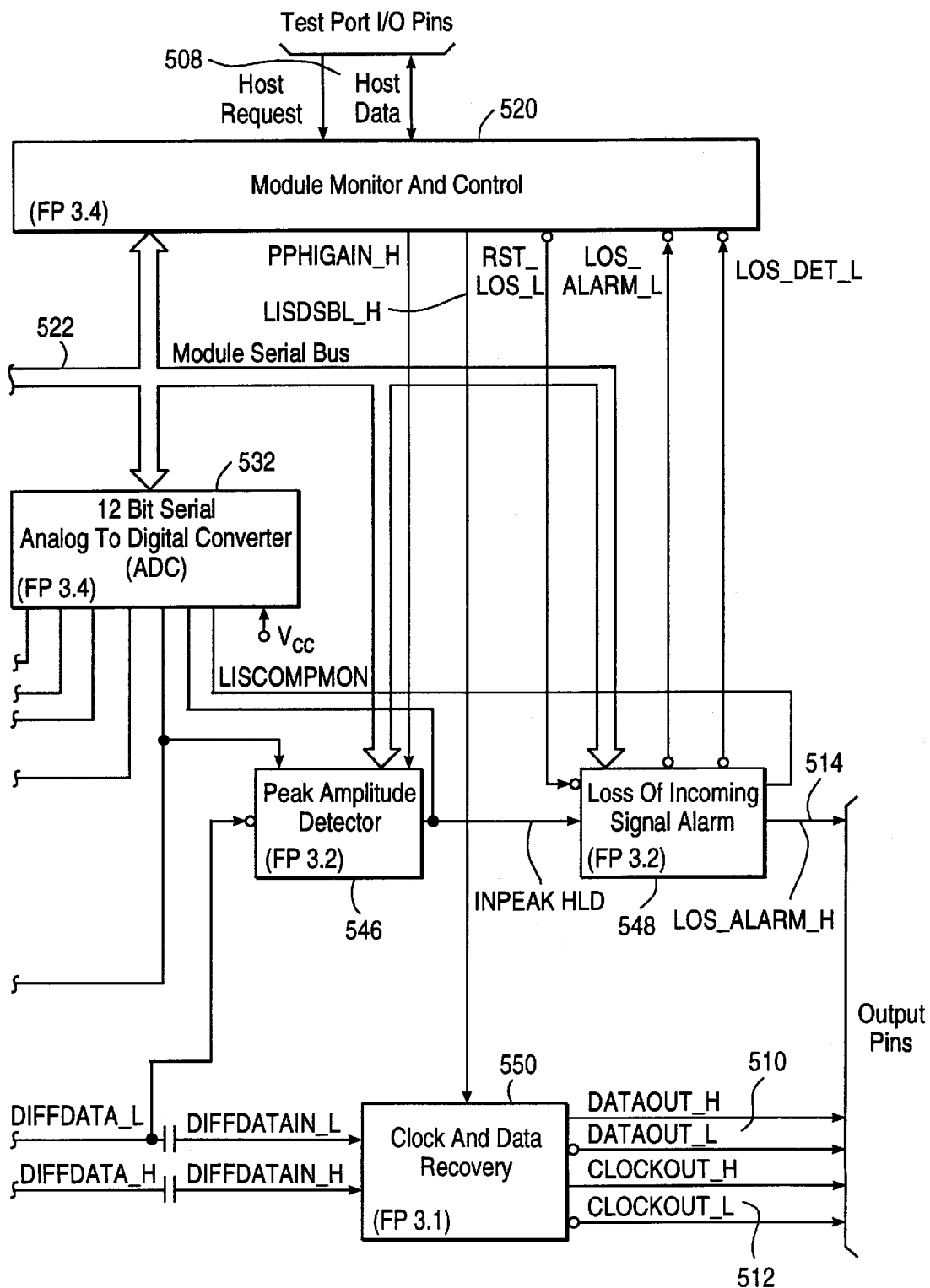

FIG. 2 illustrates in greater detail a preferred embodiment of fiberoptic receiver module 500. Receiver module 500 generally operates under control of microcontroller 520, as more fully described herein. Microcontroller 520, along with analog-to-digital converters, digital-to-analog converters and other associated circuitry, dynamically control the operational parameters of receiver module 500 based on current operating conditions, such as temperature and power supply voltage.

Light from fiberoptic 504 is coupled to avalanche photo diode (APD) 501, which is biased by APD bias voltage regulator 528. APD bias voltage regulator 528 receives bias voltage from voltage generator 524. APD bias voltage regulator 528 and photocurrent monitor 534, which produces photocurrent monitor output 516, communicate with microcontroller 520 over module serial bus 522. The photocurrent through APD 501 is measured by AGC transimpedance pre-amplifier 538, which receives a supply voltage from power supply 536. The output of pre-amplifier is input to low pass filter 540, the output of which is input to main amplifier 544. In alternative embodiments, main amplifier 544 includes a gain adjust block including a gain adjust DAC or other element that communicates with microcontroller 520 over module serial bus 522 in order to provide adjustable gain for main amplifier 544. In certain preferred embodiments, main amplifier 544 operates at its maximum gain.

In the preferred embodiment, main amplifier 544 outputs a differential data signal to clock and data recovery circuit 550, which produces ECL differential data outputs 510 and ECL differential clock outputs 512. Additionally, one side of the differential output of main amplifier 544 is coupled to peak amplitude detector 546, which presents an output to loss of incoming signal alarm 548. Loss of incoming signal alarm 548 generates loss of signal alarm 514. Both peak amplitude detector 546 and loss of incoming signal alarm 548 communicate with microcontroller 520 over module serial bus 522. It should further be noted that multi-channel analog-to-digital converter 532 receives analog information from a variety of the components of module 500 as illustrated and communicates with microcontroller 520 over module serial bus 522. For example, temperature sensor 530 has an output connected to ADC 532, by which microcontroller 520 may monitor the temperature condition of module 500.

Figure 3B:
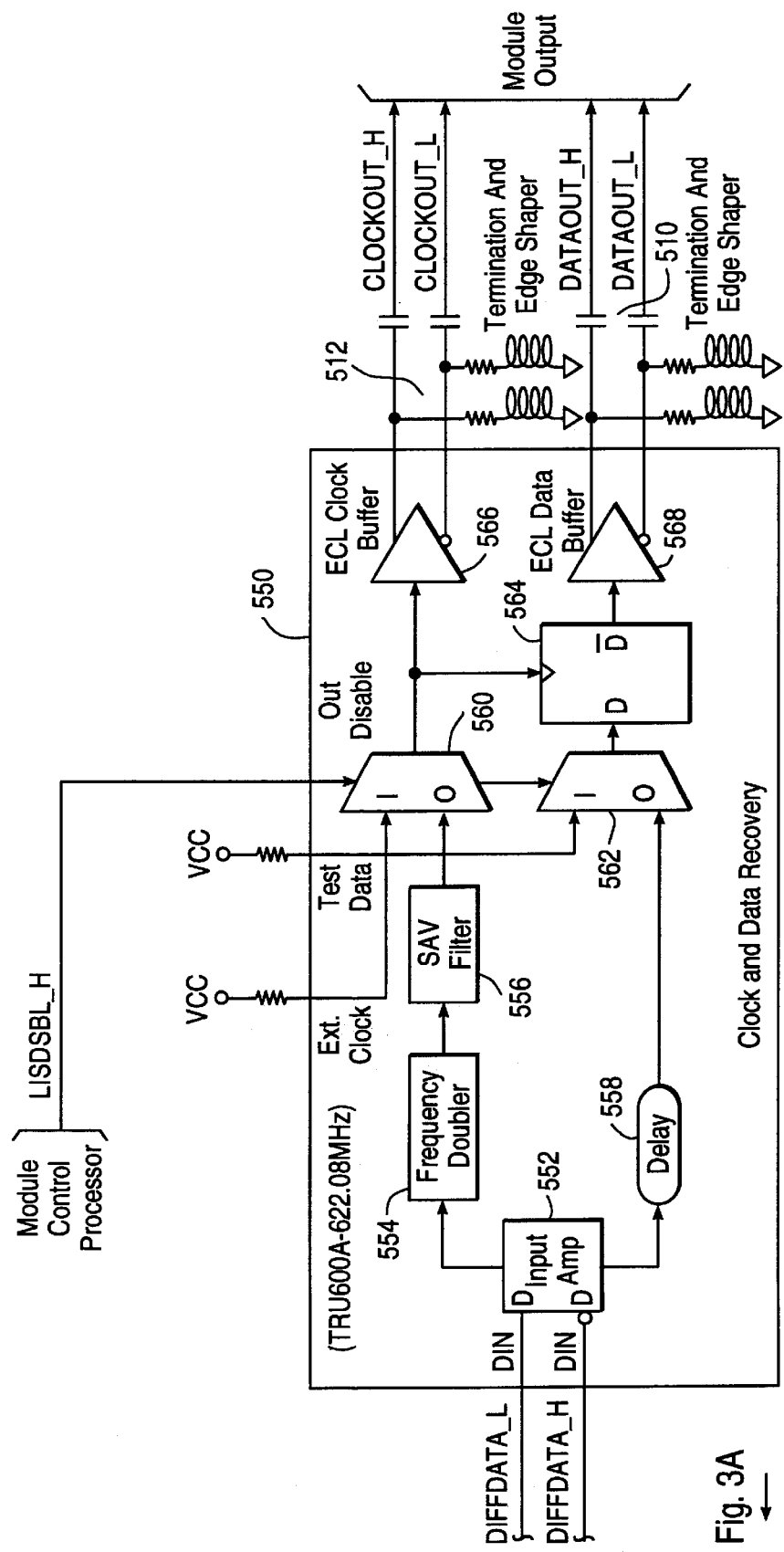
FIG. 3 is a circuit diagram illustrating the RF clock path and clock recovery circuits of a preferred embodiment of the present invention.

Referring now to FIG. 3, the data path and clock recovery circuits of the preferred embodiment of the present invention will now be explained in greater detail. The current of APD 501 is coupled to AGC transimpedance pre-amplifier 538, which consists primarily of AGC block 570 in the feedback path of amplifier 572, with an AGC time constant generally determined by an external capacitor as illustrated. The output of amplifier 572 is coupled to buffer amplifier 574, the output of which is coupled to main amplifier 544. Power is supplied to AGC transimpedance pre-amplifier 538 by way of power supply 536, which in the preferred embodiment constitutes a dc-to-dc converter, with appropriate feedback control and filtering as illustrated.

In the preferred embodiment, differential data outputs from main amplifier 544 are input to input amplifier 552 of clock and data recovery circuit 550. As previously described, one of the data outputs of main amplifier 544 is coupled to peak amplitude detector 546. One output from input amplifier 552 is input to delay 558, and another output from input amplifier 552 is input to frequency doubler 554. The output of delay 558 is input through multiplexer 562 to flip-flop 564, an output of which is input to ECL data buffer 568. In the preferred embodiment, ECL data buffer 568 is provided in order to provide differential ECL data outputs from module 500. The output of frequency doubler 554 is input to surface acoustic wave ("SAW") filter 556, from which the clock signal is recovered. The output of SAW filter 556 is input through multiplexer 560 to ECL clock buffer 566, which in the preferred embodiment is provided to ECL recovered clock outputs from module 500. As illustrated, termination and edge shaper circuits may be provided on clock outputs 512 and data outputs 510.

Multiplexers 560 and 562 are interposed in the recovered clock and data paths, respectively, of clock and data recovery circuit 550 as illustrated. Multiplexers 560 and 562, under control of microcontroller 520, permit an external clock and test data to be applied to clock and data recovery circuit 550.

To achieve high sensitivity with low input power, the present invention provides a receiver module that has high gain and at the same time a low base noise level, with minimal noise generated in the signal recovery and amplification process. The signal to noise ratio combined with the receiver gain will be referred to as the receiver's "Signal to Noise Gain Factor." There are several characteristics of optical to electrical conversion and input signal amplifiers used in preferred embodiments that greatly affect the Signal to Noise Gain Factor as the temperature and power supply conditions of the receiver module vary.

To provide a large dynamic range; and the present invention provides gain characteristics so that the receiver is capable accepting power levels ranging from hundreds of microwatts ($10^{-6}$) to hundreds of nanowatts ($10^{-9}$). In order to be able to respond to such a wide range in power, embodiments of the present invent provide that the receiver is able to dynamically adjust its gain according to different input power levels.

Embodiments of the present invention extend the dynamic range of the receiver by providing automatic gain control ("AGC") transimpedance pre-amplifier 538, which serves as a pre-amplifier for the receiver. AGC transimpedance pre-amplifier 538 converts the APD photocurrent drawn from its input into a corresponding voltage at its output. The automatic gain control of AGC transimpedance pre-amplifier 538 of the preferred embodiment has two regions. The first region provides a linear automatic gain control for low levels of current, which in certain embodiments is less than about 100–200 microamps. As the current increases above this level, AGC transimpedance pre-amplifier 538 goes into a "heavy AGC" mode, where the voltage output level remains constant for large increases in current. In effect, AGC transimpedance pre-amplifier 538 operates in its linear region for low levels of optical input when the APD bias is at its maximum; as the APD bias control goes into its third region (as more fully described below) where the photocurrent begins to increase, AGC transimpedance pre-amplifier 538 then enters the heavy AGC mode and its voltage output will remain at its maximum level.

In the preferred embodiment, main amplifier 544 serves to provide gain for extremely small optical input power levels at the sensitivity level of the receiver. At such small levels, the gains of APD 501, AGC transimpedance pre-amplifier 538 and main amplifier 544 are at their maximum level and the output of main amplifier 544 is at the minimum level at which the data and clock can be successfully recovered. In certain embodiment, main amplifier 544 has an adjustable gain, when the gain of APD 501 and AGC transimpedance pre-amplifier 538 increase to the point that the output of main amplifier 544 begins to approach the maximum level for clock and data recovery circuit 550, the gain of main amplifier 544 may accordingly be reduced to maintain this level.

Clock and data recovery circuit 550 in preferred embodiments of the present invention implement a coherent detection device that uses a SAW filter that is tuned to a base incoming frequency of, for this particular example, 622.08 MHz. Such a coherent detection device can recover data and clock from input data in which the signal to noise ratio is much less then one. Under such circumstances, generating a suitable loss of incoming signal alarm for optimum performance of the receiver module presents considerable difficulties; embodiments of the present invention provide techniques (as more fully described elsewhere herein) that substantially overcome such difficulties.

In the preferred embodiment, clock and data recovery circuit 550 is a unit provided by AT&T Microelectronics, part number TRU600A-622.08 MHZ, the users manual and/or product literature of which is incorporated herein by reference.

Figure 4A:
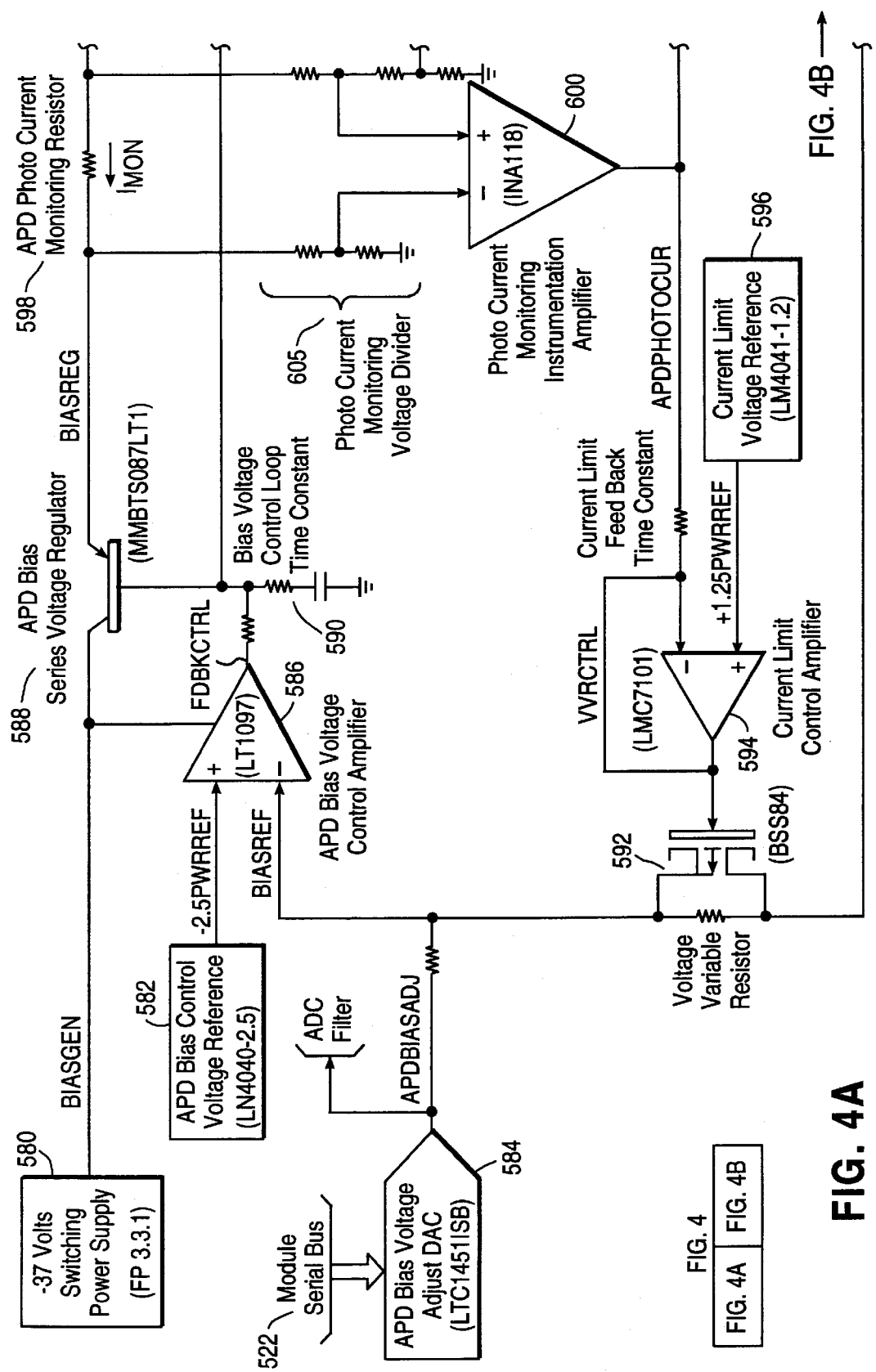
FIG. 4 is a circuit diagram illustrating the avalanche photo diode bias generator and photo current monitor circuits of a preferred embodiment of the present invention.
Figure 4B:
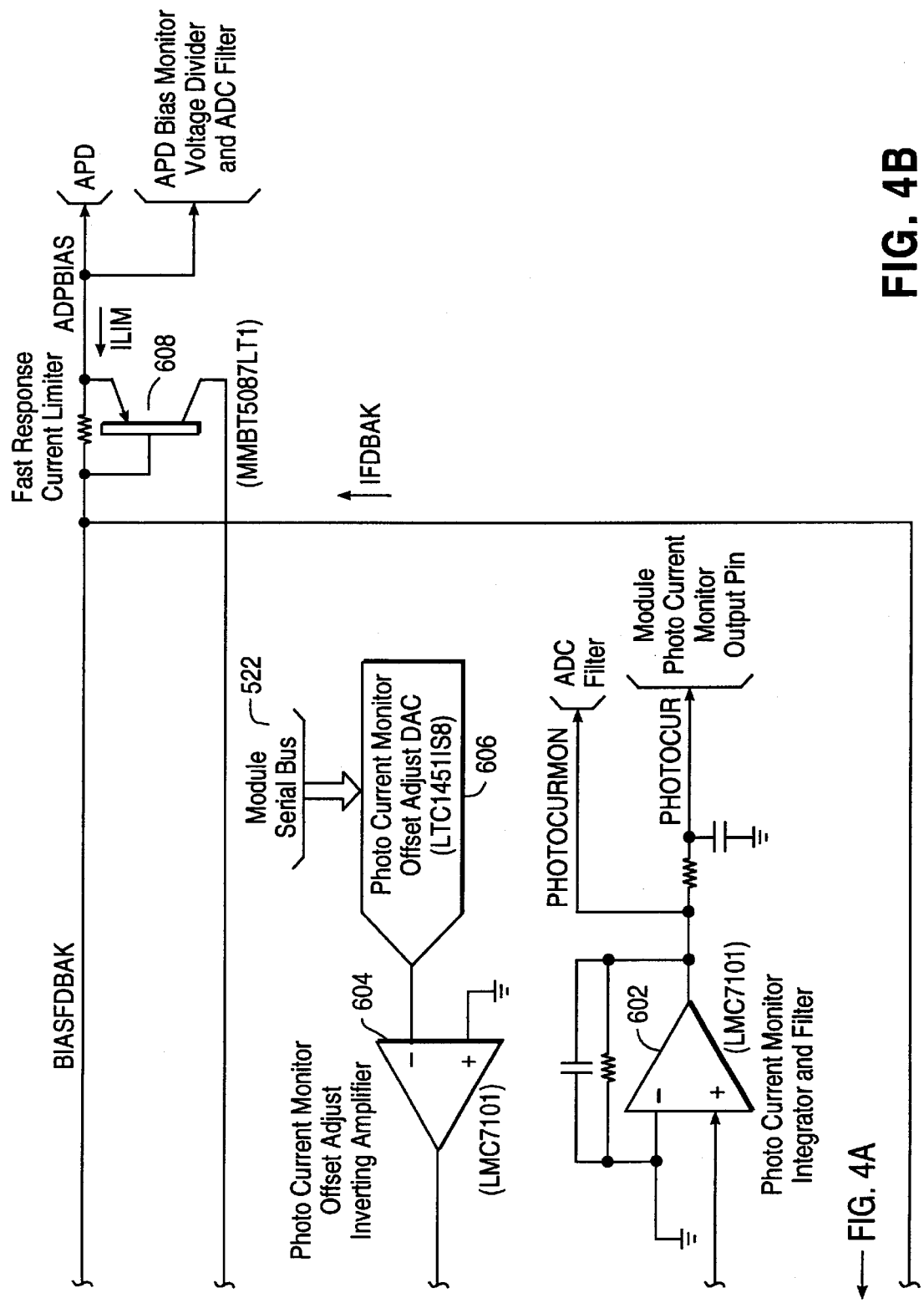

FIG. 4 illustrates in greater detail avalanche photo diode bias generator and photo current monitor circuits of the preferred embodiment of the present invention. Power supply 580 in the preferred embodiment provides a switched supply of −37 volts to APD bias series voltage regulator 588 and APD bias voltage control amplifier 586, and is implemented with a +5 to −37 volt dc to dc converter. One input of APD bias voltage control amplifier receives a reference voltage output from APD bias control voltage reference 582. The second input of APD bias voltage control amplifier 586 receives a variable bias adjust voltage from APD bias voltage adjust DAC 584, which communicates with microcontroller 520 over module serial bus 522. As more fully described herein, microcontroller 520 may, depending upon the operating conditions of module 500, such as temperature and power supply voltage, adjust the bias voltage applied to APD 501.

The output of APD bias voltage control amplifier 586 is coupled to RC time constant network 590, which serves to set the time constant of the APD bias voltage control loop. The upper node of RC time constant network 590 is coupled to the base of APD bias voltage regulator 588 and also to the collector of current limiter transistor 608. As described more fully herein, current limiter transistor 608 serves to limit the current through APD 501 in a prompt manner so as to avoid damage to APD 501 due to an overcurrent condition.

The amount of APD photo current is monitored by APD photo current monitoring resistor 598. The voltage drop across monitoring resistor 598 is provided to photo current monitoring instrumentation amplifier 600 via resistive divider network 605. Offset adjustment to photo current monitoring instrumentation amplifier 600 by way of photo current monitor offset adjust DAC 606, which communicates with microcontroller 520 over module serial bus 522. The output of photo current monitor offset adjust DAC 606 is applied to photo current monitor offset adjust inverting amplifier 604, which applies an offset adjust voltage to photo current monitoring instrumentation amplifier 600 via a resistive divider network 605 as illustrated.

The output of photo current monitoring instrumentation amplifier 600 is coupled to the input of photo current monitor integrator/filter 602, the output of which (which may be after low pass filtering as illustrated) is coupled to photo current monitor output pin 516 of module 500, and also which may be coupled to microcontroller 520 through multi-channel ADC 532 as described in more detail elsewhere herein. The output of photo current monitoring instrumentation amplifier 600 also is applied to a first (inverting) input of current limit control amplifier 594, the non-inverting input of which receives a reference voltage from current limit reference voltage source 596. The output of current limit control amplifier 594 is coupled to the control input of voltage variable resistor 592, which is positioned in the loop between the APD bias node and the inverting input of APD bias voltage control amplifier 586.

Embodiments of the present invention provide an APD bias voltage that is very stable and has low AC noise and ripple. Additionally, such embodiments also provide an APD bias voltage that is variable so the gain or multiplication factor of APD 501 may be varied according to the power of the incoming optical signal. The present invention provides such capability, while also limiting the maximum current that APD 501 can draw from the APD bias supply so as to remain below the maximum-allowed APD current level.

In preferred embodiments, the bias voltage for APD 501 is generated with a switching power supply that generates a negative supply voltage (it has been determined that a voltage of about −37 volts provides desirable results for germanium APDs as used in accordance with preferred embodiments of the present invention). The output of APD bias power supply 580 is filtered to remove the ripple associated with the switching power supply. The output of the power supply filter goes to the auto-compensating, digitally controllable voltage regulator.

Such an auto-compensating, digitally controllable APD bias voltage regulator as provided in preferred embodiments of the present invention has been determined to provide several important functions for controlling the APD's performance. First, such controllable regulation provides the standard voltage regulation function to provide a stable bias voltage for APD 501. Second, it performs an automatic gain control function for APD 501 by controlling the APD bias voltage as a function of the photocurrent through APD 501 by using a voltage variable resistor. Third, it monitors the photocurrent flowing through APD 501. Fourth, it provides a high speed over-current protection for APD 501 by automatically "folding back" (or smoothly reducing the regulators output current) as the APD photocurrent approaches the maximum current rating for the APD. Fifth, the regulator voltage output may be digitally controllable such as through a DAC that is loaded from microcontroller 520.

When receiver module 500 is operating, microcontroller 520 periodically measures the temperature and calculates the corresponding temperature index. Microcontroller 520 accesses the Best Bias Table in the memory using the temperature index. The Best Bias Value read from the table is loaded into APD bias voltage adjust DAC 584, which controls the APD bias voltage. This Best Bias Value becomes the maximum APD bias voltage for that temperature. The automatic gain control circuits may reduce this bias voltage for high levels of input power, but in the preferred embodiments the voltage will not go higher then this value.

The optical power levels that the receiver must respond to requires that the gain of the receiver vary by a large amount, typically at least 30 dB. To achieve the best overall gain and signal to noise ratio in the receiver, the gain stages in the present invention provide that the largest amount of gain was placed as close as possible to the input to the receiver, which is believed to provide advantages over other techniques.

In the receiver there are three gain stages and one gain limiting/APD current limiting stage. The gain stages are APD 501, transimpedance pre-amplifier 538, and main amplifier 544 (which in alternate embodiments may be variable). There also is an APD bias current limiting/APD gain limiting circuit to protect APD 501 from being damaged by high input power. In the preferred embodiments, each of the gain or limiting stages perform different types of AGC and each has a different time constant in responding to a change in input power.

APD bias current limiter transistor 608 and the APD bias regulator circuit (e.g., the loop incorporating photocurrent monitor resistor 598, resistive divider network 605, photocurrent monitoring amplifier 600, current limit control amplifier 594, voltage variable resistor 592, APD bias voltage control amplifier 586 and APD bias series voltage regulator 588, which collectively are sometimes referred to below as the second analog loop) control the gain of APD 501 as a function of APD 501 photocurrent. The transimpedance gain of transimpedance pre-amplifier 538 is a function of the photo current that APD 501 is drawing from its input. The gain of main amplifier 544 is controlled by the peak amplitude of its output. The control response times of the various gain control stages determine which stages have the most gain and how the gain will decrease as the input power increases. The different time constants also avoid oscillations between the control of the gain stages.

APD bias current limiter transistor 608 and the APD bias regulator circuit both control the gain of APD 501 as function of the APD's photocurrent, but they have different activation current levels and time constants, and in effect implement a "dual analog loop" control for the APD bias. The first analog loop, utilizing current limiter transistor 608, serves as a fast current limiter to respond to sudden large changes in APD current, such as if the optical input goes suddenly from zero to a large input power (such as if an optical input connection is suddenly made with receiver module 500). The first analog loop provides a quick respond current limit control loop, which serves to protect and save the APD from damage due to a large, sudden overcurrent condition. The second analog loop consisting primarily of the APD bias regulator circuit has a slower response time and provides a smoother adjustment function, and which serves primarily to maintain linear bias conditions under a wide range of APD input power conditions. With the "digital control loop" provided by microcontroller 520, preferred embodiments of the present invention provide multiple analog and digital control loops, each having different response times and conditions, and each serving different overall bias control functions.

The APD bias voltage regulator circuit provides a stable bias voltage for APD 501 and controls the level of the bias voltage. The APD bias voltage is controlled in multiple ways. Microcontroller 520 sets the APD bias voltage to the calibrated Best Bias Voltage for the current module temperature. Microcontroller 520 checks the module's temperature by way of module temperature sensor 530 and adjusts the bias voltage several times a second (this is the digital control loop discussed above). The second way that the APD bias voltage is controlled is by using the APD photocurrent that is monitored through photocurrent monitoring resistor 598 and amplifier 600, etc., to provide an automatic gain control function (this is the second analog loop discussed above).

Microcontroller 520 adjusts the APD Best Bias Voltage in small increments as the module's temperature varies slowly with time. For the discussion of the APD bias voltage regulator circuit's automatic gain control function, the Best Bias Voltage will be considered to be constant value with respect to the response time of the automatic gain control function. The AGC response time of the APD bias voltage regulator circuit is much longer than the response time of current limiter transistor 608. Also the photocurrent level at which the APD bias voltage regulator circuit's AGC function becomes active is much lower than that of current limiter transistor 608. Therefore, for slow changes in optical power and when the photocurrent is below the activation level of current limiter transistor 608, the APD bias voltage regulator circuit controls the level of the APD bias voltage.

The APD bias voltage regulator circuit of the present invention monitors the photocurrent that is being drawn by APD 501 and uses this information to control the APD's bias voltage. The output voltage of the voltage regulator circuit is determined by the resistance in its control feedback loop. Voltage variable resistor 592 is used in this feedback loop to provide a resistance that can be controlled as a function of the monitored APD photocurrent.

The photocurrent level at which the APD bias voltage regulator circuit begins to perform its AGC function is at approximately the level at which transimpedance pre-amplifier 538 leaves its linear region of AGC control and begins heavy AGC control. At photocurrent levels lower then the voltage regulator AGC activation point, the APD gain is constant at the Best Bias Voltage level and the gain of transimpedance pre-amplifier 538 is varying.

The APD bias voltage control functions that the APD bias voltage regulator circuit performs in preferred embodiments of the present invention can be described in five different regions under varying optical input conditions.

In region 1, the photocurrent is below the APD bias voltage regulator circuit's AGC threshold. In this region, the APD bias voltage is equal to the calibrated Best Bias Voltage. This is the voltage for the current temperature that provides the "best signal to noise gain." This Best Bias Voltage is updated as the module temperature changes. In this region, the transimpedance gain of transimpedance pre-amplifier 538 is at its maximum. The ac output of transimpedance pre-amplifier 538 increases as the optical input power increases. The gain of the main pre-amplifier 544 is at its maximum in this region (including with embodiments having a variable gain main amplifier, etc.), with the output of main amplifier 544 increasing as the optical input power increases.

In region 2, the output of main amplifier 544 has reached its maximum value and its output goes into a voltage limit mode of operation. In this mode the output voltage of main amplifier 544 does not increase even though its input voltage increases. In this region the gain of APD 501 and transimpedance pre-amplifier 538 operate the same as in region 1.

In region 3, the photocurrent has reached the AGC threshold of the APD bias voltage regulator circuit and current through photocurrent monitor 534 is being held constant. In this region the APD bias voltage regulator circuit's AGC function reduces the APD bias voltage as the optical power increases. This results in holding the photocurrent constant at the AGC threshold value even though the optical power is increasing. In this region the output voltage of transimpedance pre-amplifier 538 remains at a constant level because the photocurrent input to transimpedance pre-amplifier 538 is constant, even though transimpedance pre-amplifier 538 remains in the linear region. In this region, current limit control amplifier 594 changes the resistance of voltage variable resistor 592. This causes APD bias voltage control amplifier 586 to reduce the APD bias voltage from the APD Best Bias Voltage value down to the APD bias control reference voltage output from voltage reference 582. As the resistance of voltage variable resistor 592 decreases, the IFDBAK current increases, which causes the IMON current to increase even though the ILIM and the photocurrent monitoring voltage divider 605 current are decreasing as the APD bias voltage decreases.

In region 4 the APD bias voltage regulator circuit AGC reaches its maximum limit and the APD bias voltage regulator circuit reduces the APD bias voltage to the value of the reference voltage from APD bias control voltage reference 582 (−2.5 volts in the preferred embodiment). In this region the APD bias voltage remains at the reference voltage level and the gain control function is controlled by transimpedance pre-amplifier 538. In this region transimpedance pre-amplifier 538 begins its AGC mode.

In region 5, the photocurrent reaches the point where the voltage drop across the resistor in fast response current limiter 608 reduces the APD bias voltage below the reference voltage from voltage reference 582.

As will be appreciated from the description of preferred embodiment provided herein, fast response current limiter 608 provides overcurrent protection for APD 501 as well as high speed automatic bias level/AGC control by limiting the current that can flow through series voltage regulator 588 and by lowering the APD bias voltage as the current is limited. The activation point of fast response current limiter 608 is set at a higher activation level then the APD bias voltage regulator circuit and fast response current limiter 608 has a much faster response time. Fast response current limiter 608 has a response time of several microseconds such that it can quickly protect APD 501 when a large increase in optical power occurs. Fast response current limiter 608 responds at the switching speed of the amplifiers in fast response current limiter 608 and series voltage regulator 588, and in preferred embodiments no significant additional R/C time constants limit the response time of this circuit.

With no optical input power or with very low input power, the gain of APD 501 is set to its maximum value by the bias control circuits. This maximum bias voltage is the Best Bias Voltage that was determined during calibration for the module's current temperature. When the gain of APD 501 is high, a large change in optical input power will cause a very large change in APD photocurrent. In preferred embodiments, when the APD photocurrent reaches approximately two thirds of the maximum allowable photocurrent, fast response current limiter 608 begins to shut off the current flowing through series voltage regulator 588 as will reduce the APD bias voltage. As the APD bias voltage is decreased, the gain of APD 501 also will decrease, which will cause the photocurrent to decrease. At this point, fast response current limiter 608 is in an automatic gain control mode. As the photocurrent continues to increase, fast response current limiter 608 continues to cut off the photocurrent and decreases the bias voltage thus holding the photocurrent constant. The automatic gain control function will continue to operate until the APD bias voltage and APD gain are decreased to their minimum values.

Such a multi-loop control for APD bias and current in accordance with embodiments of the present invention is submitted to provide significant advantages over conventional APD circuits.

Figure 8:
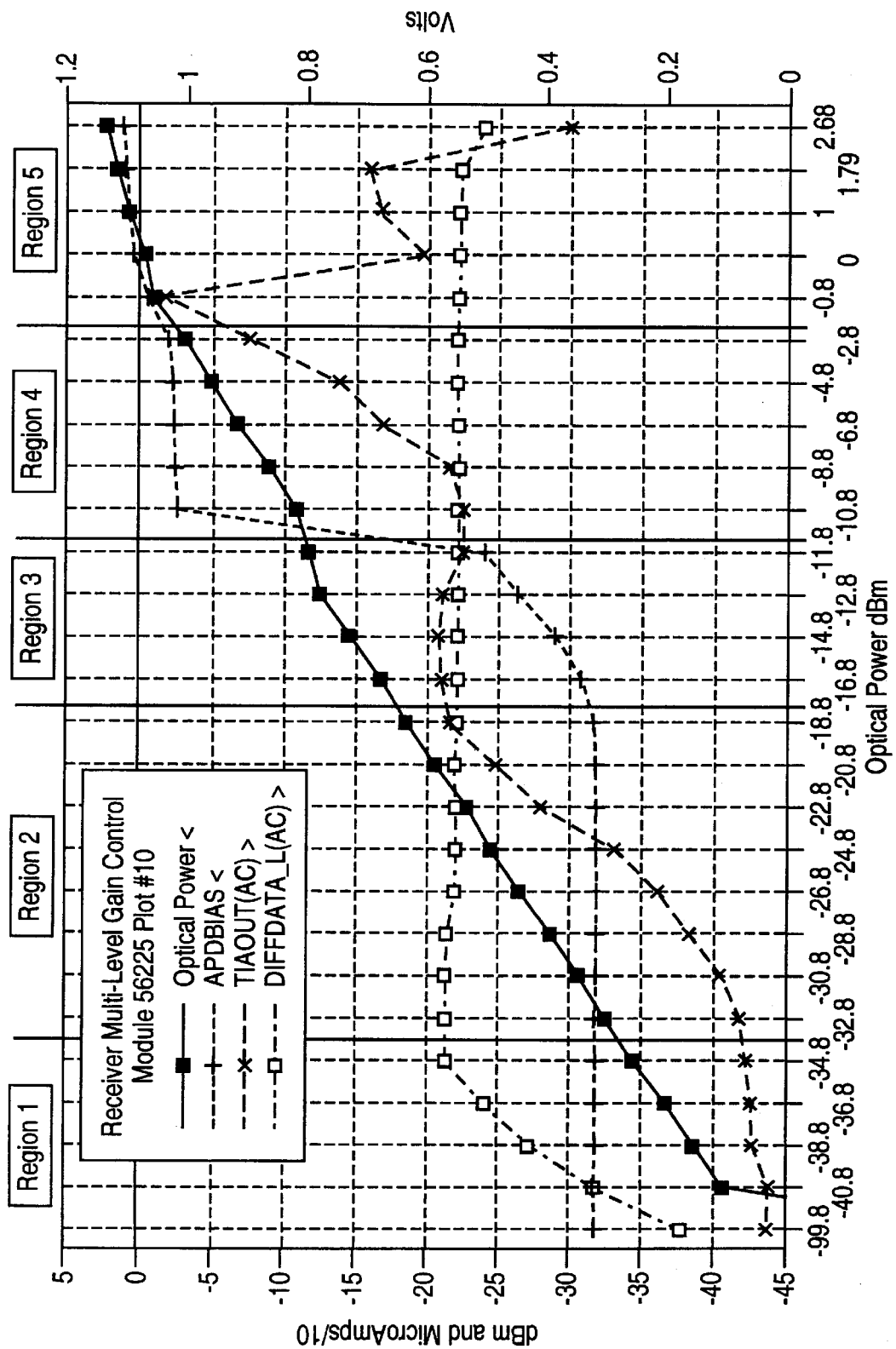
FIG. 8 is a graph illustrating operation of various gain control elements in various regions of operation of preferred embodiments of the present invention.
Figure 9:
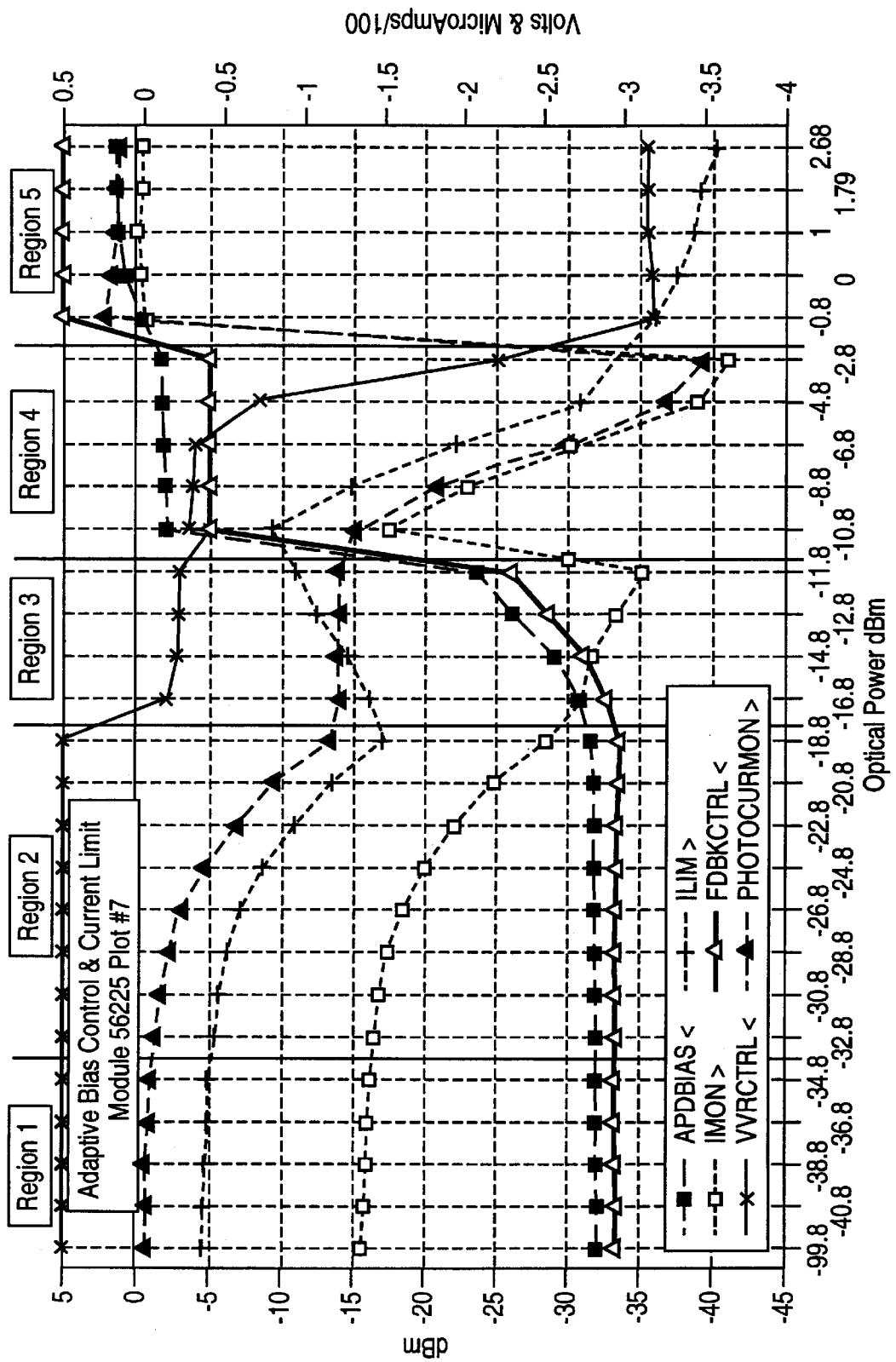
FIG. 9 is a graph illustrating various control voltages and associated responses in various regions of operation of preferred embodiments of the present invention.

FIG. 8 is a graph illustrating operation of various gain control elements in various regions of operation of preferred embodiments of the present invention, and FIG. 9 is a graph illustrating various control voltages and associated responses in various regions of operation of preferred embodiments of the present invention. As will appreciated from FIGS. 8 and 9, in accordance with the present invention, various gain and bias control elements and loops are provided in order to provide stable ADP bias and overall receiver module operation over a wide range of operating conditions.

Figure 5:
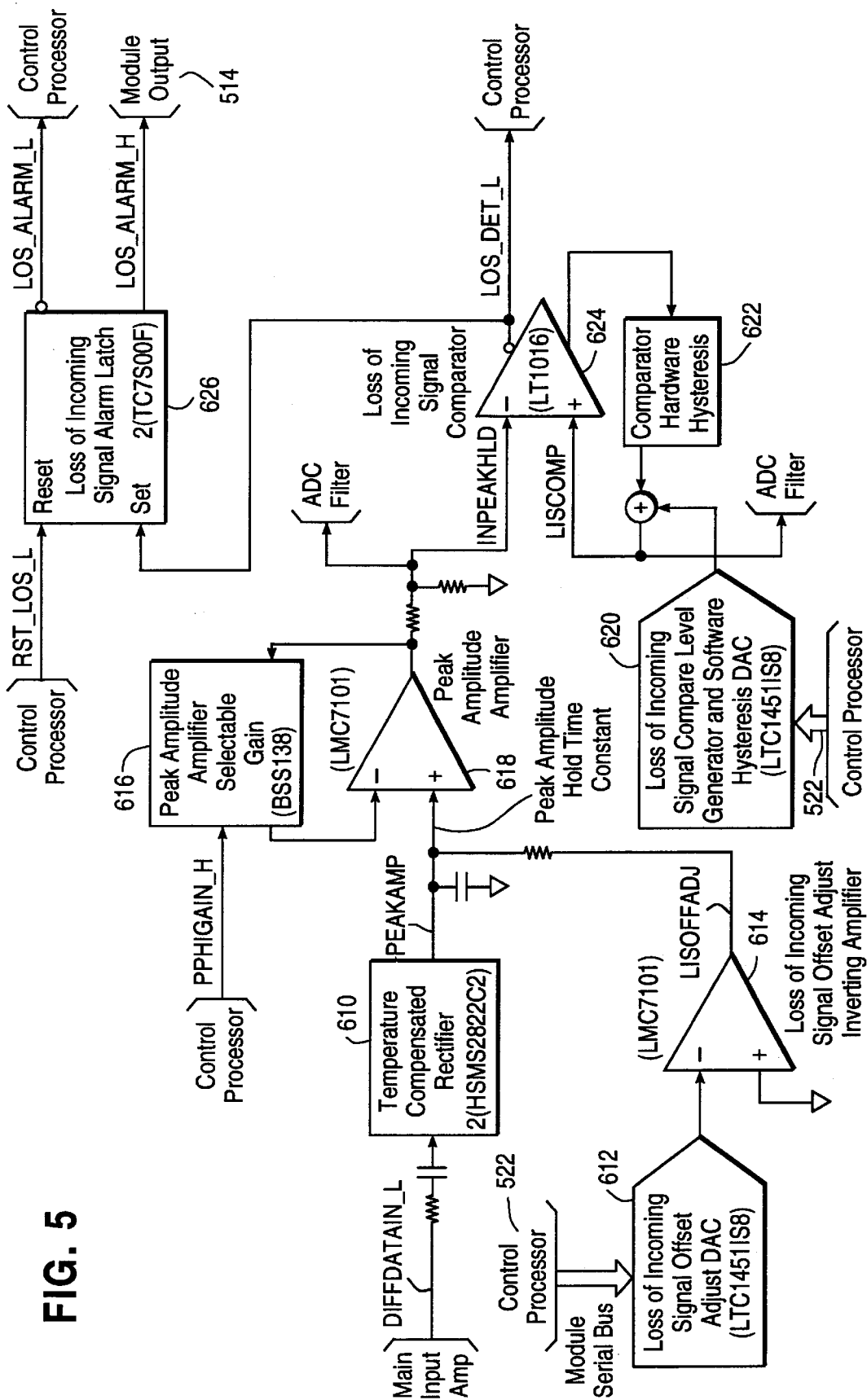
FIG. 5 is a circuit diagram of peak amplitude detector and loss of incoming signal alarm circuits of a preferred embodiment of the present invention.

FIG. 5 is a circuit diagram of peak amplitude detector and loss of incoming signal alarm circuits of the preferred embodiment of the present invention. The output of main amplifier 544 is input to temperature compensated rectifier 610, the output of which is coupled to peak amplitude amplifier 618 having peak amplitude adjustable gain block 616, which receives a control input from microcontroller 520. Microcontroller 520 also communicates with loss of incoming signal adjust DAC over module serial bus 522. Through inverting amplifier 614, loss of incoming signal DAC 612, under control of microcontroller 520, may adjust the offset presented to peak amplitude amplifier 618.

The output of peak amplitude amplifier 618 is coupled to the inverting input of loss of incoming signal comparator 624. The non-inverting input of loss of incoming signal comparator 624 receives the output of compare level generator and software hysteresis DAC 620 summed with the output of comparator hardware hysteresis block 622. The output of loss of incoming signal comparator 624 ("loss of incoming signal" detect signal) is coupled to microcontroller 520 and also to the set input of loss of incoming signal alarm latch 626, which generates a loss of signal alarm that is coupled to microcontroller 520 and to loss of signal alarm output 514 of module 500.

The efficiency of the optical-to-electrical conversion, the amount of noise generated in the conversion, and the gain of the different amplification stages all vary with temperature and power supply. Because of the filtering and phase locking techniques used in preferred embodiments of the present invention, the clock and data recovery circuit 550 can recover the data and clock from a signal where the signal to noise ratio is much less than one. The signal amplitude and the amount of noise generated vary with both temperature and power supply, therefore, to accurately detect the loss of signal power level requires that the peak amplitude detector be compensated as the temperature and power supply change.

The loss of incoming signal alarm ("LIS") is asserted when the input power coming into the optical detector drops below a power level that is calibrated to a specified error rate. In preferred embodiments, this power level is at least 1 dB below the input power level at which the $1 \times 10^{-3}$ bit error rate occurs. To generate the LIS alarm, the average peak amplitude voltage (INPEAKHLD) of the data signal is compared to an LIS trigger comparison reference voltage (LISCOMP) using high speed comparator 624. The LIS trigger comparison reference voltage is generated using DAC 620 that is loaded by microcontroller 520 from a set of look up tables. The values for the look up tables are determined during the calibration process and incorporate "software hysteresis" within the trigger level as more fully described elsewhere herein The average peak amplitude of the voltage between the main amplifier 544 and clock and data recovery circuit 550 is used as the comparison voltage for turning on and off the LIS alarm. The voltage between main amplifier 544 and clock and data recovery circuit 550 is rectified using high speed switching diodes (temperature compensated rectifier 610) and is filtered, averaged with a peak hold circuit and amplified to generate the average peak amplitude voltage. The peak amplitude voltage goes to one input of high speed comparator 624 that is used to generate the LIS alarm detect signal. The trigger comparison voltage for the other side of the comparator is controlled by DAC 620 which is loaded by microcontroller 520. The value for the trigger comparison voltages for turning on and off the alarm are determined during calibration as more fully described elsewhere herein.

The methods used for measuring the input power level are based on rectifying the ac RF data signal and detecting its peak level using a peak amplitude detector circuit. In the preferred embodiment, the LIS alarm is configured so as to not assert for sequences of less then 100 consecutive identical digits (either 1's or 0's). Therefore, the peak amplitude detector must hold the peak amplitude of the last "1" data bit for longer then 100 bit periods (e.g., in the preferred embodiment, about 160 nanoseconds). This requires an averaging peak amplitude detector be used for determining the power level of the input signal. The LIS alarm of the preferred embodiment also asserts in less than 25 microseconds; therefore, the time constant for the averaging peak amplitude detector must be between the limits to meet the consecutive identical digits requirements and the alarm assertion requirements.

Another challenge overcome in the present invention is that, in generating the LIS alarm for a particular input power level, the peak amplitude voltage coming from the peak amplitude detector varies as power supply and temperature vary. There are several components in the RF input path, and the performance of each of these vary differently with temperature and power supply changes. Because of such variations, the peak amplitude voltage is a complex function of several variables changing at different rates in several different devices. Because of these variations, the comparison level for turning on and off the LIS alarm at a specific power level is adjusted in preferred embodiments as the receiver's temperature and power supply levels change. Also, as the module's temperature changes the input power level that causes a $1\times10^{-3}$ bit error rate also changes.

As more fully described elsewhere herein, the bit error rate tester ("BERT") has a sync loss function that can be set to a $1\times10^{-3}$ error rate. During calibration, this sync loss function of the BERT is used to determine the attenuation setting for the optical attenuator required for a bit error rate level of $1\times10^{-3}$. The LIS compare level generator DAC (DAC 620), which generates the LIS trigger comparison reference voltage, is set to zero and the optical attenuator is set to the power level at which the alarm is to assert (typically 1 to 2 dB below sync loss). The value in LIS compare level generator DAC 620 is increased until the output of the comparator asserts. The output of the comparator is referred to as the LIS error detect signal. The value in the LIS compare level generator DAC 620 that causes the LIS error detect signal to assert is stored in memory along with its associated temperature and power supply setting. At each temperature step in the calibration process, the module is tested at the minimum and maximum power supply settings and the values are stored.

When the LIS error detect signal asserts, a small portion of its positive output is feed back to the comparator's positive input. This provides a small positive hardware hysteresis when the comparator changes state. This positive feedback reinforces the change and prevents the output of the comparator from oscillating for small variations in the input level around the turn on trigger level.

The trigger level for turning off the LIS alarm is typically one to two dB above the power level that caused the alarm to assert. The compare value in LIS compare level generator DAC 620 for turning off the alarm is determined by setting the optical attenuator to the power level at which the alarm is to turn off and then determining the DAC control value at which the alarm turns off. After the LIS alarm turns on during the calibration process, the LIS compare level generator DAC 620 is set to its maximum value before the optical attenuator is changed to the off power level. After optical attenuator is set to the desired alarm turn off value, the value in the LIS compare level generator DAC 620 is then decreased until the alarm turns off. This value is stored in the calibration data as the LIS alarm software hysteresis off value.

The data from the module calibration is converted into tables that are indexed by temperature and power supply levels. The calibration tables are loaded into non-volatile memory in the receiver module and used by microcontroller 520 during operation of the module to adjust the value in the LIS compare level generator DAC 620 as the module's temperature and power supply change.

Figure 6:
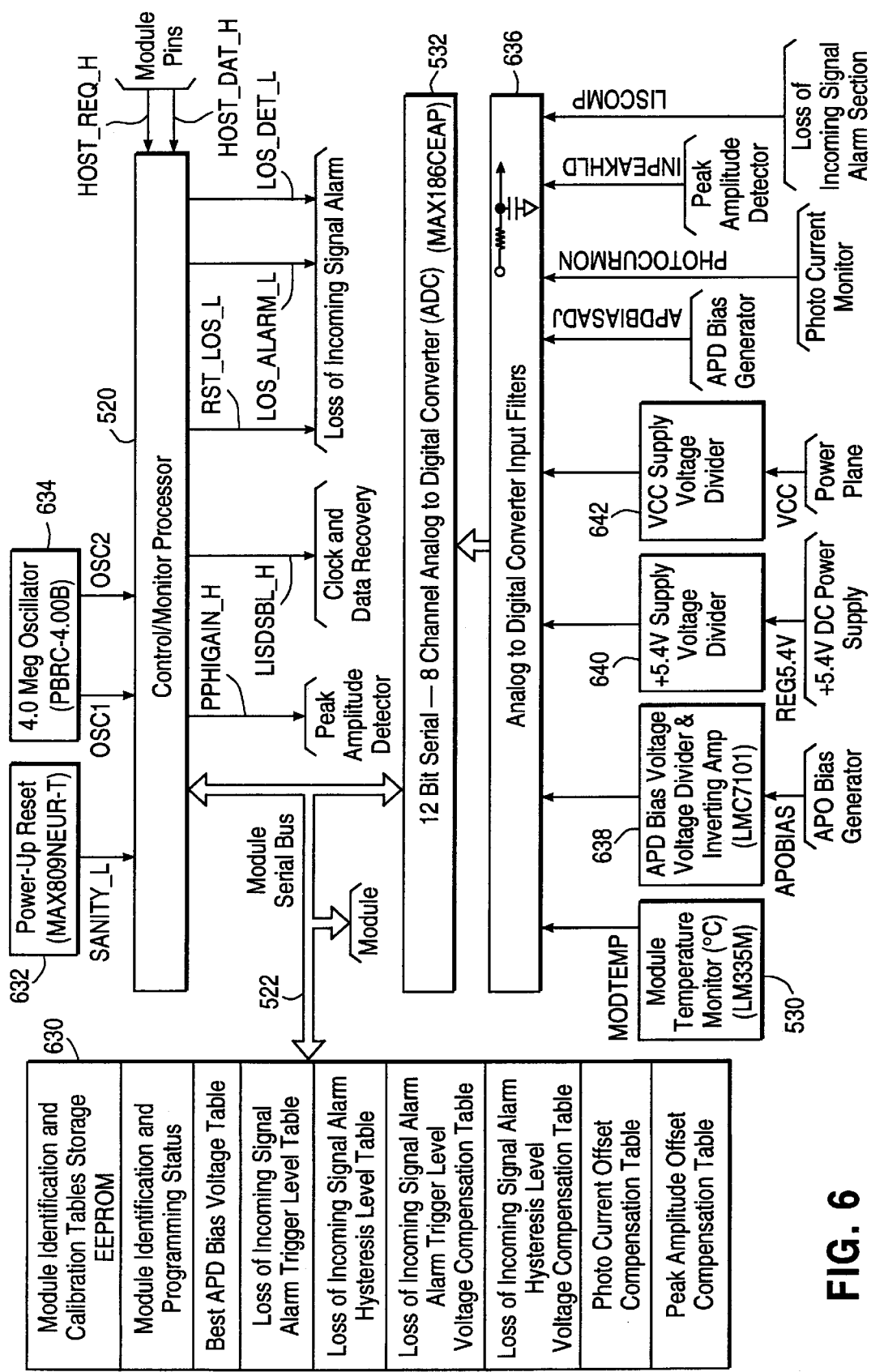
FIG. 6 is a block diagram illustrating module monitor and control portions of a preferred embodiment of the present invention.

FIG. 6 is a block diagram illustrating module monitor and control portions of the preferred embodiment of the present invention. Microcontroller 520 communicates with various components of module 500 by way of module serial bus 522. Microcontroller 520 also receives information from various analog components of module 500 by way of multi-channel ADC 532, certain inputs of which are coupled through ADC input filters 636 and/or various dividers or other circuit blocks. For purposes of the present invention, it is important that ADC 532 receive inputs from appropriate components of module 500 in a form that is suitable for accurate capture of the incoming analog information (i.e., at an appropriate portion of the ADC input signal range, etc.). In the preferred embodiments: temperature sensor 530 is coupled to ADC input filters 636; the APD bias voltage from the output of photocurrent monitor 534 (from APD bias voltage regulator 528) is coupled to ADC input filters 636 through voltage divider/input amplifier 638; the voltage from power supply 536 is coupled to ADC input filters 636 through voltage divider 640; the voltage from the main VCC supply is coupled to ADC input filters 636 through voltage divider 642; and inputs from APD bias generator 528, photocurrent monitor 534, peak amplitude detector 546 and the noninverting input of the loss of incoming signal comparator are directly connected to ADC input filters 636.

A description of how microcontroller 520 references the stored tables using the current module temperature will now be described in more detail. The microcode executed by microcontroller 520 continuously monitors the module's temperature, indexes the tables and updates several control voltages using 12-bit (in preferred embodiments) DACs. Microcontroller 520, which in one embodiment is a Motorola 68HC05, computes an index into the table as a function of temperature. To understand how such indices are computed, it is first necessary to understand the operation of the internal temperature sensor and ADCs used in certain embodiments of the present invention. It is understood that such discussion is for understanding in better detail how memory indexing in certain preferred embodiments is implemented, but that such discussion is not intended to serve as a limitation on other embodiments/aspects of the present invention. For example, in certain alternative embodiments polynomial coefficients are stored and utilized in order to calculate various operational parameters, etc.

The temperature sensor (such as temperature sensor 530) outputs a voltage based on sensed temperature. In the preferred embodiment, the voltage output (V) of the sensor is equal to the temperature ($T_{K°}$) in degrees Kelvin×10 millivolts. In other words, the voltage increases by 10 millivolts for every degree of temperature increase. The ADC uses a reference voltage of 4.096 volts, meaning that the full scale range of the sampled signal is from 0 volts to 4.096 volts (the ADC output coding will change by one LSB for every 1 millivolt of analog input change). This translates into a full scale temperature range from 0° K to 409.6° K. As is well known, temperature in degrees Kelvin (K°) is easily converted to degrees Celsius (C.°) by the formula C.°=°K−273. In this exemplary discussion, the full scale temperature range in degrees Celsius is then approximately −273.0° C. to +136.6° C., which, of course, exceeds typical temperature ranges for receiver modules.

Preferred embodiments seek to make the computation of the table index as simple as possible, which may enable use of low-cost microcontrollers such as the 68HC05 (i.e., which does not directly support floating point calculations). Binary division and multiplication can easily be accomplished by simple shift operations. Therefore performing division by 2, 4, 8, 16 . . . ,etc. is easily accomplished with such a microcontroller. Due to the nature of the temperature sensor and the ADC, temperature changes of 0.1° C. will be detected. If a temperature range of −55.0° C. to 104.9° C. (explained below) is selected as a valid range to index the table, then 1600 discrete values are possible (−55.0° C. to 104.9° C. in 0.1° C. steps yields 1600 possible discrete values). The EEPROM/non-volatile memory used in the preferred embodiment only contains 512 bytes, and therefore 1600 12-bit values for a DAC adjust table is not an adequate solution. Rather than have the table index on 0.1° C. steps, a larger step is used in preferred embodiments of the present invention. Having 50 entries at in a table would require 100 of the 512 bytes, which is a more reasonable approach (each entry contains two bytes in order to obtain at least 12-bits). Dividing the temperature range into 50 entries would yield a 3.2° C. step between table entries (this translates to an ADC step of 32 counts between entries). A temperature range of −55° C. to 104.9° C. translates to an ADC range of 2180 to 3779. In certain preferred embodiments, the 68HC05 microcontroller computes the table index for a fifty word 16 bit word table in the following manner. (1) Read the temperature via the ADC and obtain 12-bit value N. (2) If the value N is out of range, force N to an upper or lower limit. Valid temperatures are defined from −55.0° C. (N=2180) to 104.9° C. (N=3779). These temperature extremes are outside the range of a −40° C. to +85° C. module (as in preferred embodiments of the present invention), but are used as boundaries in the table (i.e., the table has some margin which extends beyond the preferred embodiment's range boundaries). (3) De-bias the temperature by subtracting 2180 from the value N. This essentially correlates the [0] index (0th element of the table) with −55° C. If the temperature read via the DAC is −55.0° C. (N=2180), then subtracting 2180 from N will yield a result of 0. After subtracting 2180 from N, N will vary from 0 to 1599 (1600 possible discrete values of N). (4) Divide the result of the previous operation by 16. This is accomplished with 4 shift right zero instructions. This will result in a byte index between 0 and 99. (5) The least significant bit of the previous operation is then cleared. This truncates the result to an even address providing a byte index of the MSB of the table 16 bit word entry. This results in an even byte index not greater than 98. Adding this byte index to the base address of the table will point to the MSB of the 16 bit value to be read from the EEPROM, such as reading a 12-bit value to be loaded into a DAC used in the present invention.

This indexing scheme of the preferred embodiment results in 50 word entries in the table. Each entry in the table covers a 3.1° C. temperature spread. There is a 3.2° C. step between the base temperature associated with one table entry and its adjacent entry. Also in the preferred embodiment, the APD best bias adjust table/peak amplitude gain control table, the LIS on compare level table, and the LIS off hysteresis compare table are 50 word entry tables. In the preferred embodiment, the LIS on compare voltage adjust table is a 50 byte table and requires a different index, and the photocurrent offset zero adjust table and the peak amplitude offset adjust table contain 25 word entries. In the preferred embodiment, these two indexes are derived by further dividing the byte index (50 words). The byte index for the 50 byte table is generated by doing a one logical shift zero right operation. The byte index for the 25 word tables is generated by clearing bit 0 of the byte index (50 Bytes). The 25 word tables cover a 6.2° C. temperature spread.

The compare voltage for turning on and off the LIS alarm is a function of the positive power supply voltage. Microcontroller 520 in the preferred embodiment compensates for the current power supply when determining the LIS alarm trigger level. During calibration the LIS alarm on trigger level and off trigger level are determined for both minimum and maximum power supply values. The voltage between the minimum and maximum power supply is divided into 16 voltage compensation partitions. The first voltage partition of zero corresponds to the actual trigger levels determined at the minimum power supply settings. Therefore, for the first voltage compensation partition no compensation is required because the LIS and hysteresis table entries already contain the actual value for minimum power supplies. There are 15 voltage partitions between this minimum entry and the value required for the maximum power supply.

The size of the voltage compensation per partition is determined by subtracting the trigger level at maximum power supply from the trigger level at minimum power supply and then dividing this value by 15. The voltage partition compensation values for the LIS on trigger level values are stored in the LIS on compare voltage compensation table and the voltage partition compensation values for the LIS off trigger level are stored in the LIS off compare voltage compensation table.

The microcode continuously monitors the VCC power supply plane (+5 volts) using using a 12-bit ADC. A divide by 2 voltage divider is used to read the VCC voltage to keep it within the input range of the ADC. If the voltage read is outside of the allowed tolerances, the value read is limited to the upper or lower power supply tolerance value. The lower power supply tolerance divided by 2 is then subtracted from the limited value read to provide a number between 0 and 250, for 250 millivolts. This number is divided by 16 using four shifts to determine the voltage partition number of the current power supply level.

Figure 7:
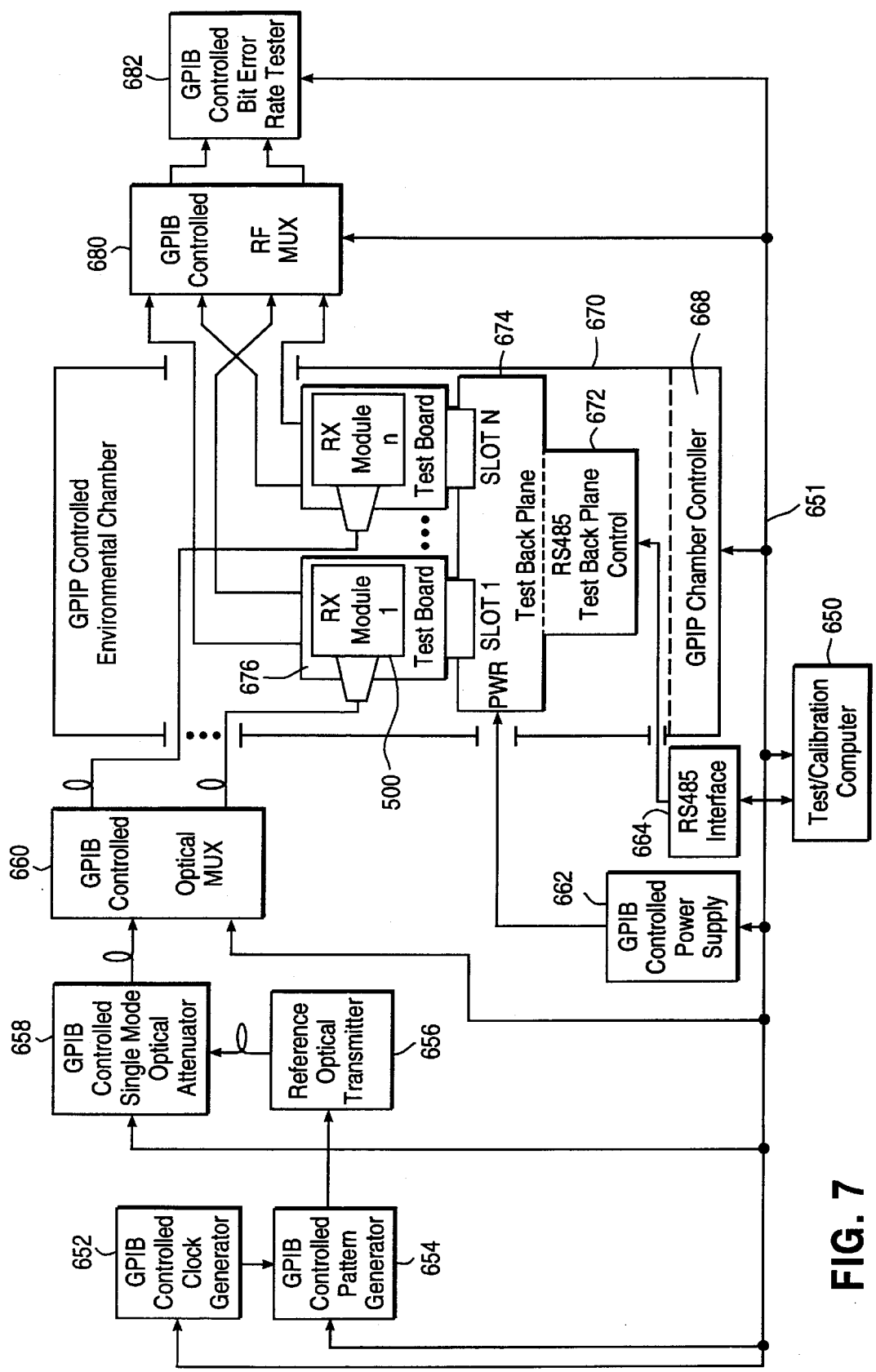
FIG. 7 is a block diagram illustrating a calibration, verification and test arrangement in accordance with the present invention.

FIG. 7 is a block diagram illustrating a calibration, verification and test arrangement in accordance with preferred embodiments of the present invention. Modules 500 to be calibrated, etc. are mounted on test boards 676, which are inserted into slots on test back plane 674, to which is coupled RS485 communication control unit 672. Modules 500 are calibrated in environmental chamber 670, which in the preferred embodiments is controlled by GPIB chamber controller 668 under control of test/calibration computer 650. It has been determined that, with intelligent modules as provided in accordance with the present invention, a large number of such modules may be calibrated, verified and tested in an efficient manner using such a backplane approach.

Test/calibration computer 650 communicates over bus 651 to a variety of the components utilized in calibration systems in accordance with the present invention. Test/calibration computer 650 communicates with clock generator 652, pattern generator 654, reference optical transmitter 656, optical attenuator 658 and optical multiplexer 660 in order to provide optical pulses to the modules under test. Test/calibration computer 650 communicates with power supply 662, which supplies power to test back plane 674, and also with RS485 interface 664, which provides serial communication capabilities to communication control unit 672. Additionally, test/calibration computer 650 communicates with multiplexer 680 and bit error rate tester 682, which receive signals from modules 500 being calibrated, etc., in environmental chamber 670. In the preferred embodiments, all such components communicate over a common GPIB-type interface base, thereby enabling computer control of various test and calibration procedures in accordance with the present invention.

The Best Bias Voltage for the module in measured at multiple points over the modules operating temperature range and the data is stored for generation of the Best Bias Calibration Curves or Tables. This Best Bias Voltage data is measured using a Pattern Generator, an Optical Attenuator, a Bit Error Rate Tester (BERT), a computer, and an Environmental Chamber. The APD Bias Voltage can be varied by a host computer using the serial test interface to the module and the corresponding error rate for that voltage can be measured by the Bit Error Rate Tester and read by the host computer through the GPIB bus interface between the host and the BERT.

The Environmental Chamber is controlled by the host computer using the GPIB bus. The chamber is stabilized at one of the calibration temperatures and then the host computer varies the APD's Bias Voltage within the module. The APD bias voltage is varied using the serial interface to the module to load a Digital To Analog Converter that controls the level of the APD bias voltage.

The Break Down Voltage for the APD is used as the reference point in finding the Best Bias Voltage. The Best Bias Voltage is typically around 0.9 of the Break Down Voltage, but it will vary with temperature. The Break Down Voltage is found by disabling the optical input and then increasing the bias voltage until photocurrents in the range of hundreds of microamps are measured.

Finding the Best Bias Voltage is a two step process, first a coarse bias adjust is used to find the approximate Best Bias Voltage, and then a finer resolution is used to determine the Best Bias Voltage with more accuracy. During the first phase, the APD Bias Voltage is varied by the host computer from 0.7 of the Break Down Voltage up to the Break Down Voltage and error rate is then measured for each voltage. The APD bias voltage with the lowest error rate is used as the center of the sweep for the finer resolution bias voltage sweep. The lowest error rate at the finer resolution becomes the Best Bias Voltage for that temperature. The modules temperature is measured through the serial interface to the microcontroller and is stored along with the best bias data.

The Best Bias Calibration data is converted into a temperature indexed table. To generate the temperature index, the operating temperature range for the table is divided into "n" partitions. "n" is determined by dividing the temperature range by the temperature resolution (degrees C. per partition). The number of partitions needed is determined by the linearity of the data to be stored in the table and by the slope of the calibration data to temperature curve. The data points taken during calibration are loaded into the table at temperature index location corresponding to the measured module temperature for that data. After the calibration data has been loaded, the empty points in the table are filled in by interpolating between the calibration points.

To more fully understand preferred embodiments of the present invention, which include methods of manufacturing (calibrating, verifying, testing, etc.) and operating receiver modules, FIGS. 10–17 will now be described. In discussing FIGS. 10–17, references may be made to elements included in other of the figures, for example, FIG. 7.

Figure 10:
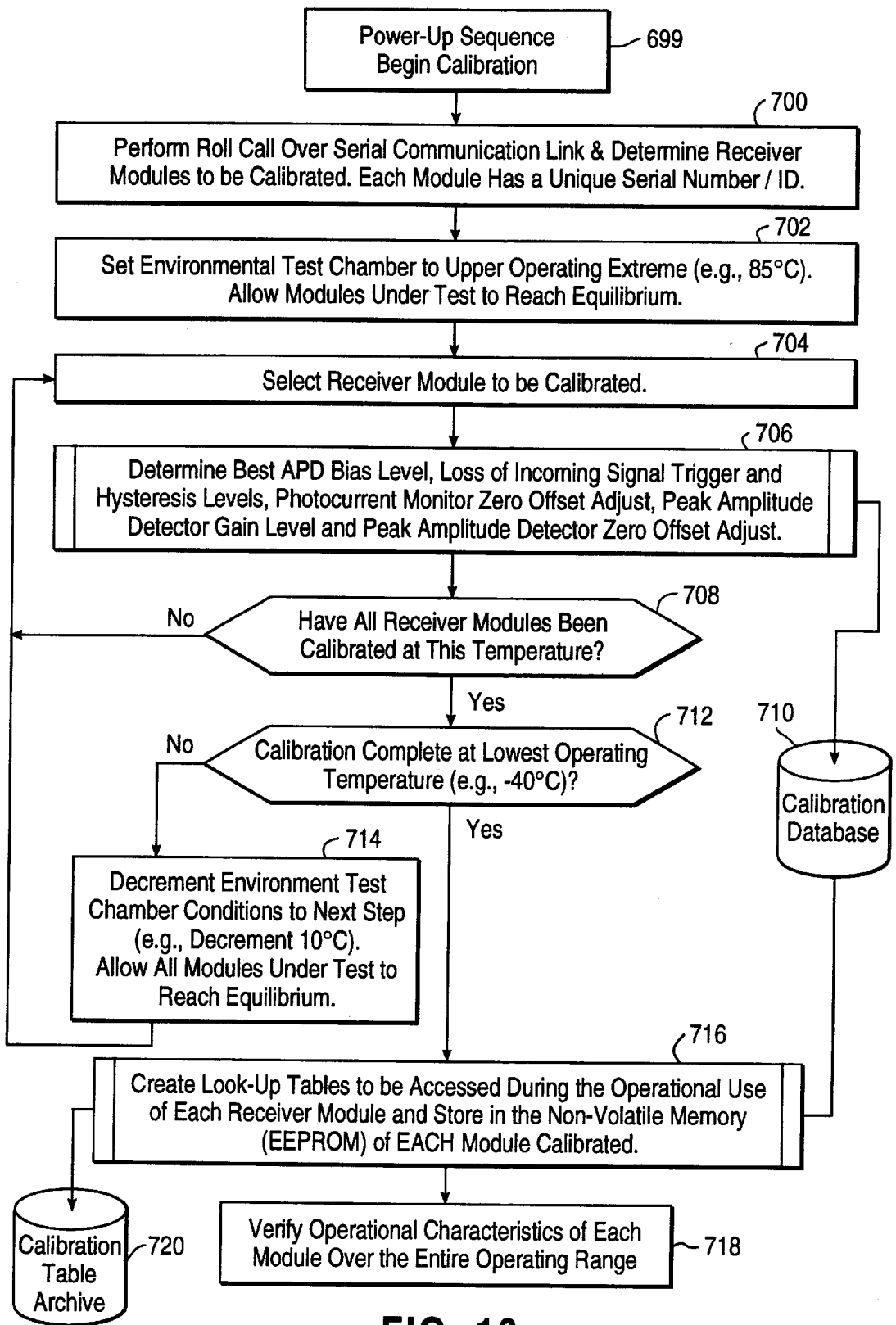
FIG. 10 is a flow chart illustrating a calibration sequence for preferred embodiments of the present invention.

FIG. 10 is a flow chart illustrating a sequence used in the manufacturing, calibration, testing, verification, etc., of receiver modules in accordance with preferred embodiments of the present invention. At step 699, the start-up (or power-up, etc.) sequence is initiated, and a receiver module calibration process begins. At step 700, test/calibration computer 650 performs a roll call with receiver modules 500, which may be in environmental chamber 670, over bus 651 and serial communications port 508. As a result of this process, computer 650 determines the number, type and identification, etc., of the receiver modules to be calibrated. In preferred embodiments, each of receiver modules 500 has a unique identifying serial number.

At step 702, environmental test chamber 670 is controlled by computer 650 to be set at the upper operating extreme, for example 85 degrees C. Step 702 is maintained for a time sufficient for receiver modules 500 to reach equilibrium at the upper operating temperature. At step 704, in the preferred embodiment, a particular receiver module 500 is selected for calibration. In other embodiments, components shown in FIG. 7 may be duplicated so that multiple of receiver modules 500 may be calibrated in parallel.

At step 706, under control of computer 650, parameters for the selected receiver module are determined, which in the preferred embodiment include the Best APD Bias Level, loss of incoming signal trigger and hysteresis levels, photocurrent monitor zero offset adjust, peak amplitude detector gain level and peak amplitude detector zero offset adjust level, and such calibration data is logged to calibration database 710. Step 706 will be discussed in more detail in connection with FIGS. 11–13.

At step 708, a determination is made as to whether all of receiver modules 500 in environmental chamber 670 have been calibrated. If not, then the process returns to step 704 and another of receiver modules 500 is selected. If yes, then the process proceeds to step 712. At step 712, a determination is made as to whether calibration has been completed at the lowest operating temperature (i.e., have the modules been calibrated over the entire, desired temperature range). If no, then at step 714 computer 650 adjusts (decrements, in preferred embodiments) the temperature of environmental chamber 670, and, after reaching equilibrium, the process returns to step 704 to select one of receiver modules 500 to be calibrated at the new temperature. If yes, then at step 716 look-up tables are created that will be accessed by microcontroller 520 during operation of receiver modules 500. Such look-up table data is stored in calibration table archive 720. At step 718, the operation of each of receiver modules 500 may be verified over the entire desired temperature and power supply operating ranges.

Figure 11:
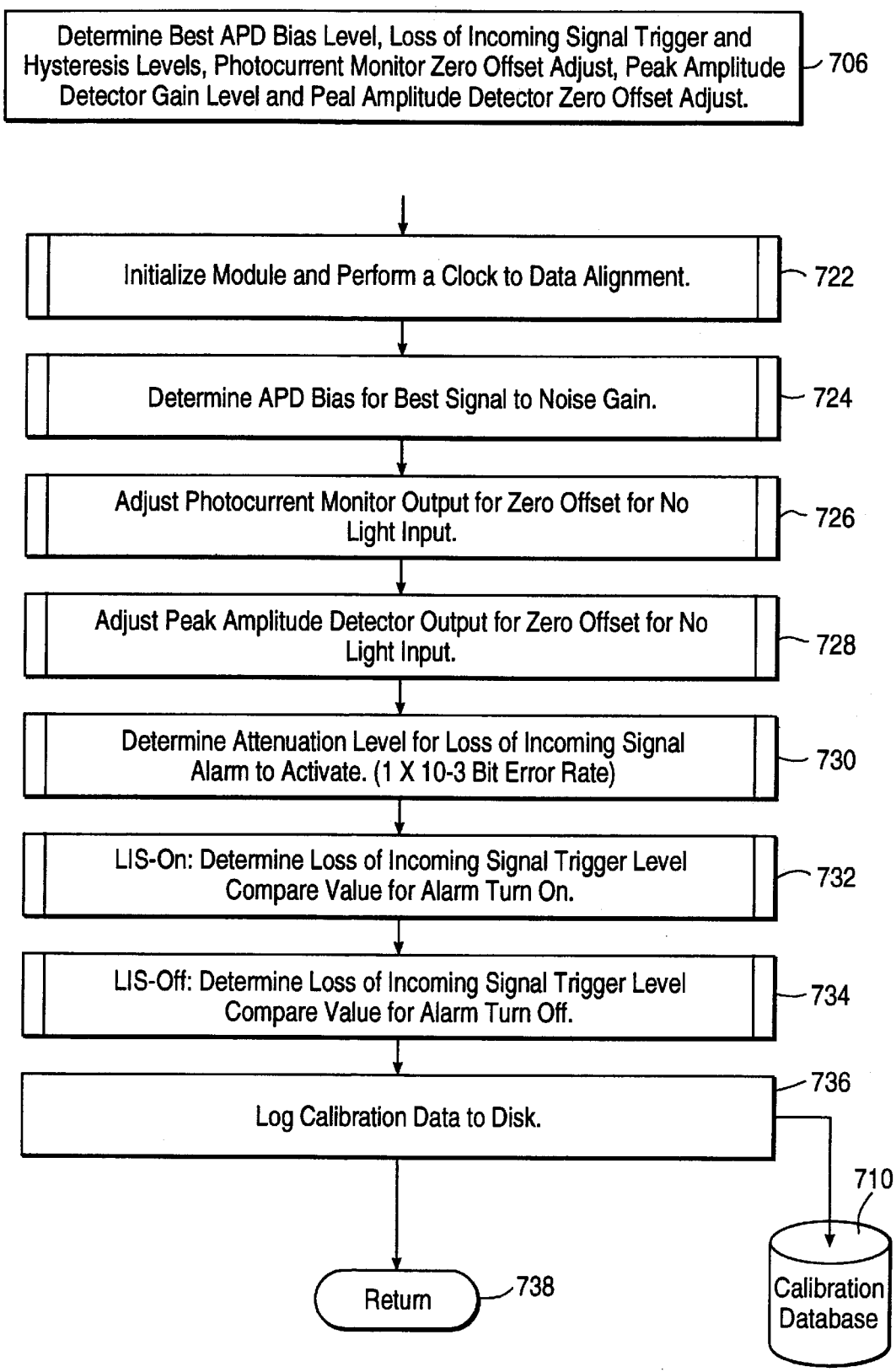
FIG. 11 is a flow chart illustrating a sequence for determining the "best APD bias level" in accordance with embodiments of the present invention.

FIG. 11 describes in greater detail step 706 of FIG. 10. At step 722, the selected receiver module is initialized and a "clock to data alignment" is performed. Generally, at step 722, computer 650 adjusts elements such as optical attenuator 658, initializes the particular one of receiver modules 500 that is to be calibrated, confirms the particular of receiver modules 500 to be calibrated and its temperature, using a microwave transition analyzer, for example, to perform a clock to data alignment, and to otherwise puts the calibration components and receiver module 500 in condition for further calibration steps.

At step 724, the APD bias for best signal to noise gain is determined. Step 724 is discussed in greater detail in connection with FIG. 12. At step 726, the photocurrent monitor output is adjusted for zero offset for no light input. At step 728, the peak amplitude detector output is adjusted for zero offset for no light input. At step 730, the attenuation level for loss of incoming signal alarm to activate is determined (for example, the attenuator is adjusted so that the loss of incoming signal alarm reliably asserts below a $1\times10^{-3}$ bit error rate level in preferred embodiments). At step 732, the loss of incoming signal trigger level compare value for alarm turn-on is determined. Step 732 is discussed in greater detail in connection with FIG. 13. At step 734, the loss of incoming signal trigger level compare value for alarm turn-off is determined. As previously described, this trigger level in preferred embodiments is determined by adjusting attenuator 658 so as to be one to two dB above the power level for turn-on, which desirably adds in accordance with the present invention loss of incoming signal software hysteresis. Step 734 in preferred embodiments is performed by setting loss of incoming signal level control DAC 620 to its maximum setting, adjusting attenuator 658 as describe above, and then decrementing DAC 620 until loss of incoming signal alarm 626 turns off. At step 736, the calibration data is logged to calibration database 710. At step 738, the process returns to the sequence illustrated in FIG. 10.

Figure 12:
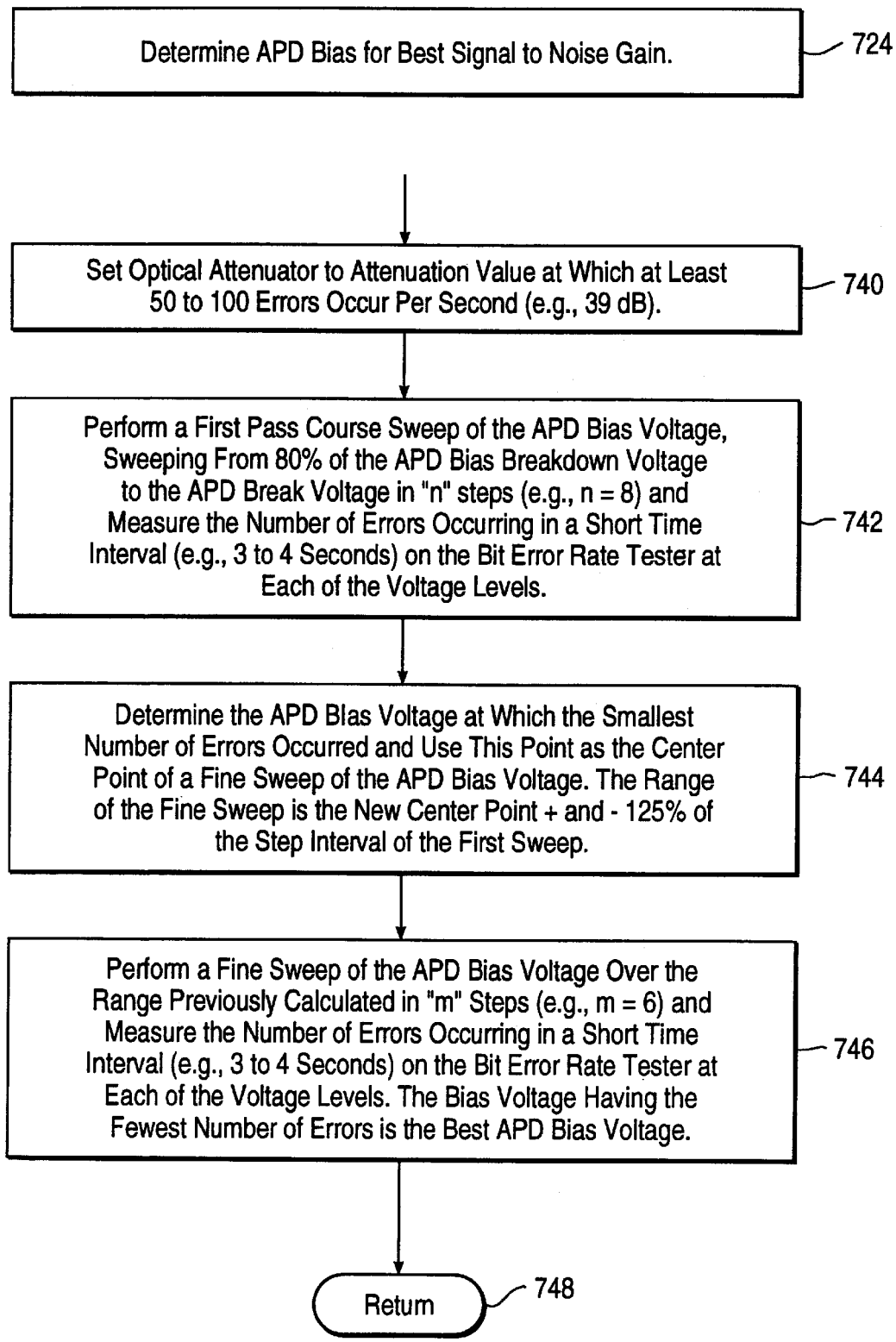
FIG. 12 is a flow chart illustrating a sequence for determining an APD bias having a "best signal to noise gain" in accordance with embodiments of the present invention.

FIG. 12 is a flow chart illustrating a sequence for determining an APD bias having a "best signal to noise gain" at step 724 in accordance with embodiments of the present invention. At step 740, in preferred embodiments optical attenuator 658 is step to an attenuation value at which at least 50 to 100 errors per second are occurring. An exemplary setting is 39 dB. At step 742, a first pass coarse sweep of the APD bias voltage is performed, during which the APD bias is swept from 80% of the APD bias breakdown voltage to the APD breakdown voltage in "n" steps (e.g., 8 steps). At each step, the number of errors (with bit error rate tester 682) occurring at a predetermined time interval at the particular APD bias setting is determined, examples being 3 to 4 seconds, or at least 2, 3, 4 or 5 seconds being determined to provide desirable results in terms of accuracy/time efficiency in accordance with the present invention.

At step 744, the APD bias voltage at which the smallest number of errors occurred is determined, and this bias voltage level is used as a basis for a second pass fine sweep of the APD bias voltage. In preferred embodiments, the determined bias voltage level is used as a center point for the second pass fine sweep, with the range of the second pass sweep being +/−125% of the step interval of the first sweep. The dual pass sweeping technique has been determined to provide a particularly expedient method of determining an appropriate APD bias voltage in accordance with preferred embodiments of the present invention.

At step 746, the second pass fine sweep of the APD bias voltage is performed in, for example, "m" steps (such as m=6), and the number of errors (with bit error rate tester 682) occurring at a predetermined time interval at the particular APD bias setting is determined. The bias voltage having the fewest number of errors is the Best APD Bias Voltage in accordance with preferred embodiments of the present invention. In alternative embodiments, additional finer sweeps may be performed to determine an optimum APD bias level. At step 748, the process returns to the sequence illustrated in FIG. 11.

Figure 13:
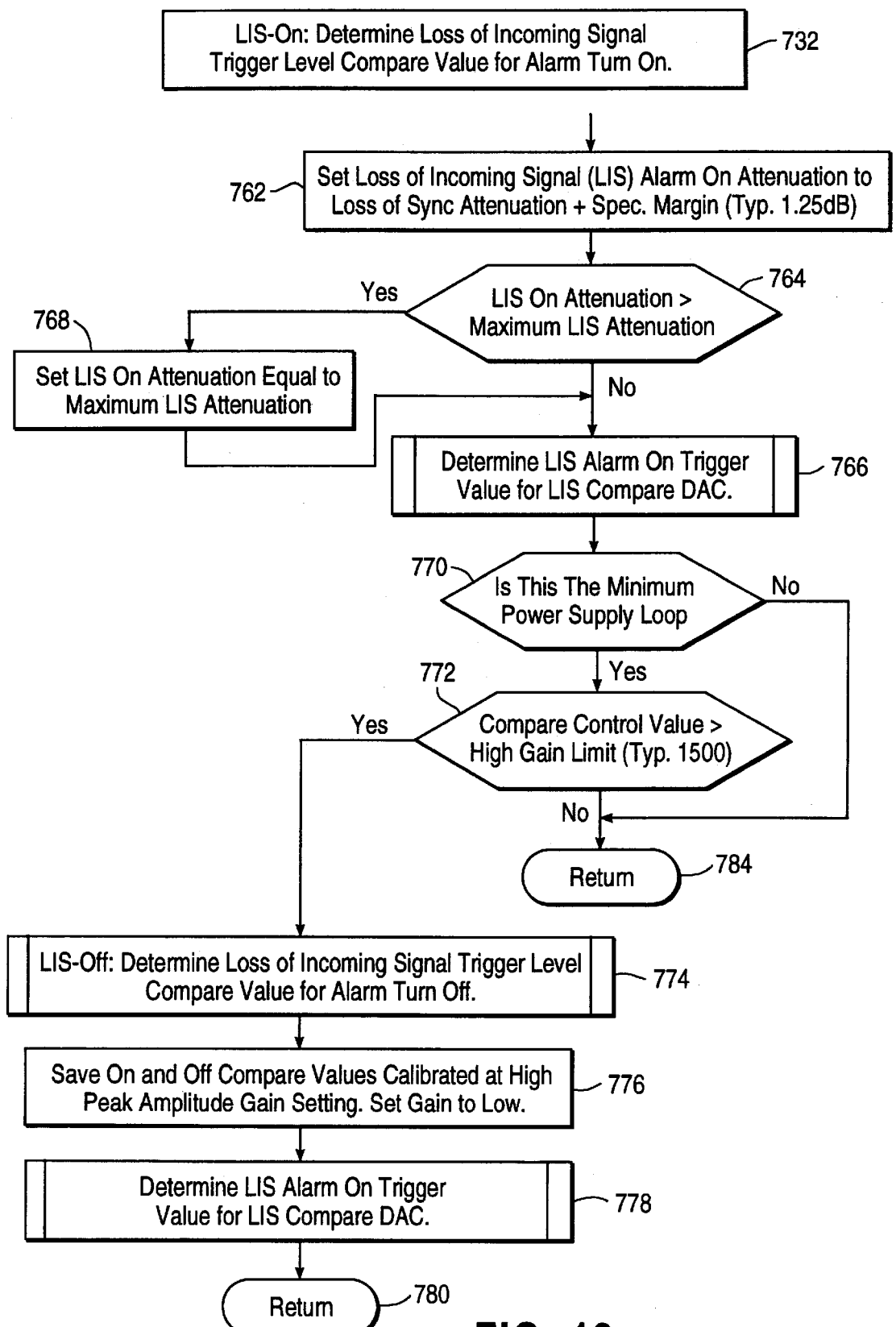
FIG. 13 is a flow chart illustrating a sequence for determining a loss of incoming signal trigger level in accordance with embodiments of the present invention.

FIG. 13 is a flow chart illustrating a sequence for determining a loss of incoming signal trigger level at step 732 in accordance with embodiments of the present invention. At step 762, the loss of incoming signal alarm on attenuation is set to the loss of sync attenuation plus a predetermined margin, which in preferred embodiments is 1.25 dB. At step 764, a determination is made as to whether the loss of incoming signal attenuation level is greater than the maximum loss of incoming signal attenuation level. If yes, the loss of incoming signal on attenuation level is set to be equal to the maximum loss of incoming signal attenuation, at step 768. If no, the process proceeds directly to step 766.

At step 766, the loss of incoming signal alarm turn-on trigger value for loss of incoming signal compare DAC 620 is determined, in preferred embodiments by incrementing loss of incoming signal compare DAC 620 until the loss of incoming signal alarm turns on. At step 770, it is determined whether this is the minimum power supply loop. If no, then the process returns to the sequence illustrated in FIG. 11. If yes, then at step 772 the compare control value is compared with the high gain limit, which in preferred embodiments is 1500. If no, then the process at step 784 returns to the sequence illustrated in FIG. 11. If yes, then at step 774 the loss of incoming signal alarm turn-off trigger value for loss of incoming signal compare DAC 620 is determined, in preferred embodiments by decrementing loss of incoming signal compare DAC 620 until the loss of incoming signal alarm turns off.

At step 776, the on and off compare values calibrated at the high peak amplitude gain setting are saved. Then, because the loss of incoming signal compare DAC 620 may reach its limit, the gain is set to low, attenuator 658 is set to the loss of sync attenuation setting and the loss of sync voltage is set for low gain. At step 778, the loss of incoming signal trigger level compare value for alarm turn-on is determined for the new low gain settings. At step 780, the process returns to the sequence illustrated in FIG. 11.

Using the data stored in non-volatile memory which is accessed by microcontroller 520 during operation of receiver modules in accordance with the present invention, such receiver modules adapt various parameters in order to adapt the receiver module's performance in response to changing conditions. Such operation will be described in greater detail in connection with FIGS. 14–17.

Figure 14:
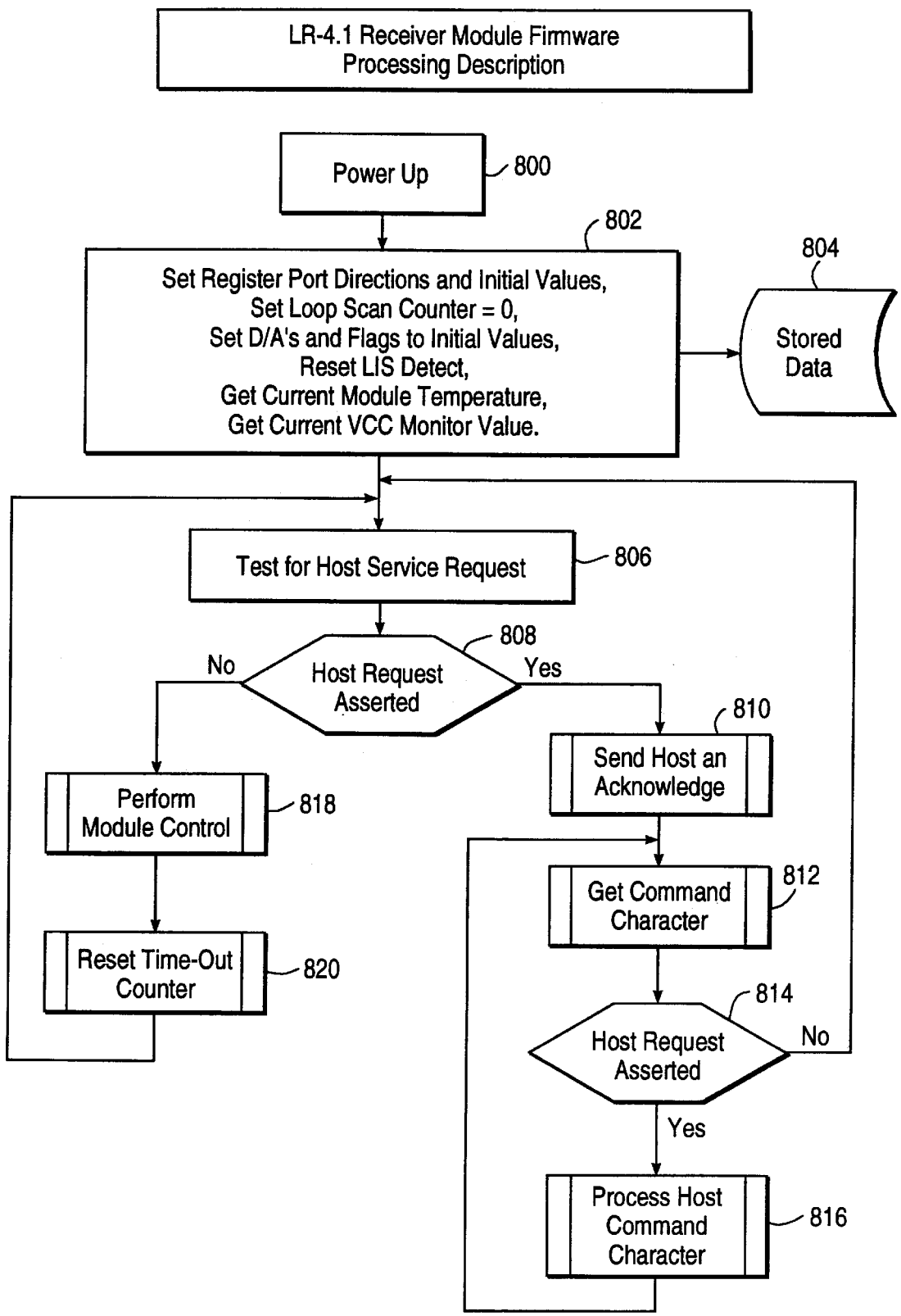
FIG. 14 is a flow chart illustrating a sequence of operation of receiver modules in accordance with preferred embodiments of the present invention.

FIG. 14 is a flow chart illustrating a sequence of operation of receiver modules in accordance with preferred embodiments of the present invention. It is assumed that such receiver modules have been calibrated with a process such as described above. At step 800, the module is powered up. At step 802, microcontroller 520 accesses stored data 804 (such as non-volatile memory such as EEPROM) and sets register port directions and initial values, sets a loop scan counter to 0, sets DAC values and flags to initial values, resets the loss of incoming signal detect signal (i.e., reset alarm latch 626). Microcontroller also gets the current module temperature and the current VCC monitor value. At step 806 a test is performed as to whether a host service request (external controlling computer, such as test computer 650 or some other controlling computer, such as a controlling computer for the communication network in which the receiver module is operating) has been asserted (such as over serial port 508 or other control pin of microcontroller 520). Based on the test of step 806, at step 808 a determination is made of whether a host request has been asserted. If yes, the process proceeds to step 810 to service the host request. If no, the process proceeds to step 818 to perform a module control sequence.

At step 818, a module control process is performed. At step 820, a reset time-out count is performed and the process returns to step 806. The timeout counter in microcontroller 520 is used to provide a processor reset function (or "watchdog timeout"). The timeout counter is hardware incremented and if overflows causes reset of microcontroller 520. During normal operation, the timeout counter is periodically reset by software in order prevent such resetting. Step 818 will be discussed in greater detail in connection with FIGS. 15, 16A and 16B.

Figure 15:
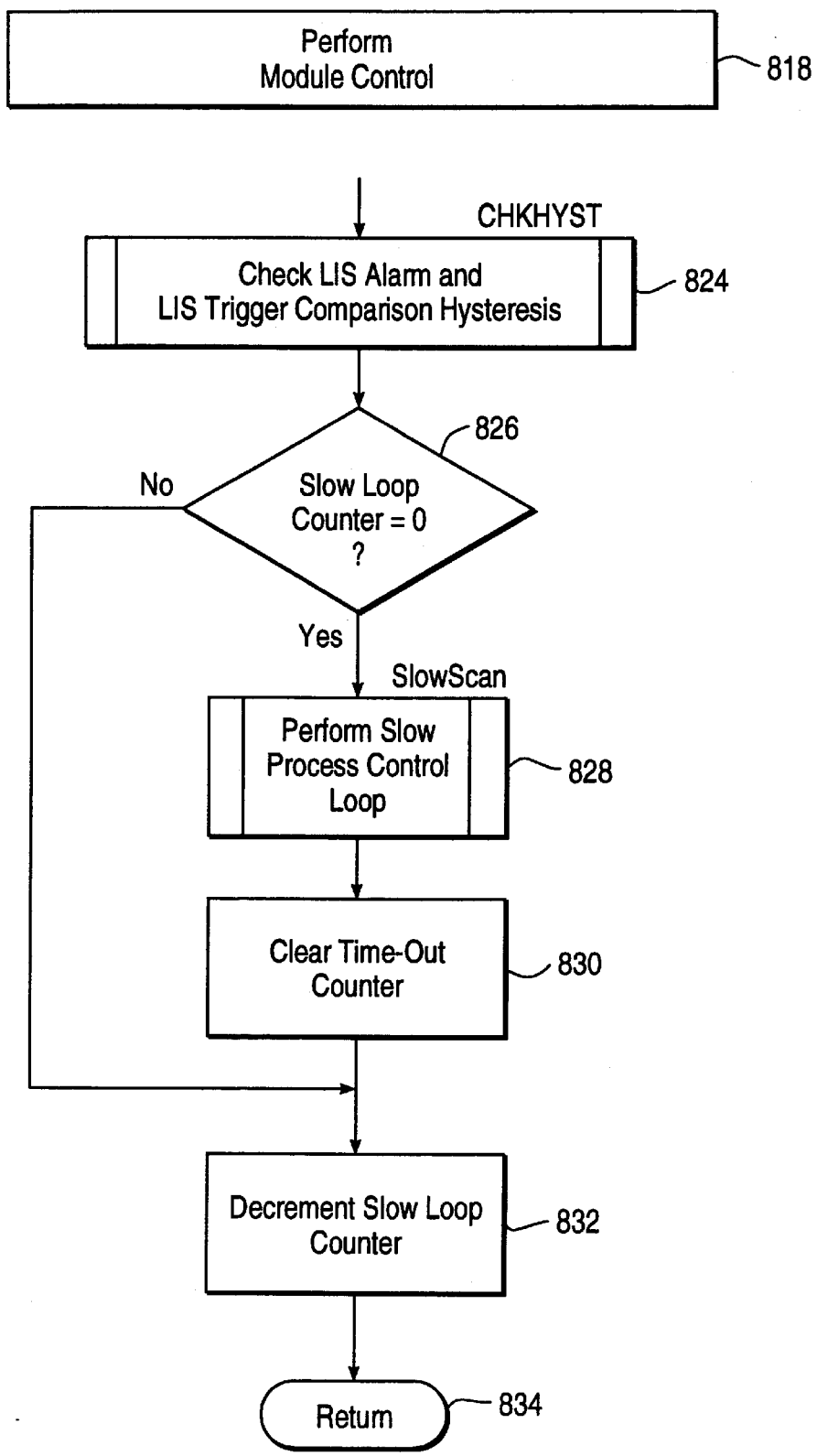
FIG. 15 is a flow chart illustrating a sequence for performing module control in accordance with embodiments of the present invention.

Referring to FIG. 15, at step 824 a check is made of the loss of incoming signal alarm and the loss of incoming signal trigger comparison hysteresis. At step 824, it is determined whether the loss of incoming signal alarm is set, and, as appropriate, outputs of clock recovery and data circuit 550 are enabled or disabled, loss of incoming signal flag is set or reset, and any software hysteresis processing is carried. For example, in preferred embodiments the software hysteresis is used to set a higher value to loss of incoming signal compare level DAC 620 after loss of incoming signal has been detected, and at step 824 such setting to a higher value (or resetting if the loss of incoming signal is no longer detected, etc.) is performed. The functions of step 824 are repeated periodically throughout software execution in order to meet a predetermined time specification for the maximum time permitted before the loss of incoming signal alarm is turned off (e.g., in preferred embodiments the alarm is turned on by hardware and turned off by software, etc.).

At step 826, a slow loop counter is tested. If the slow loop counter is not 0, then the process proceeds to step 832, at which time the slow loop counter is decremented and the process (at step 834) returns to the sequence illustrated in FIG. 14. If the slow loop counter is equal to 0, then at step 828 a slow process control loop is performed. Step 828 is discussed in greater detail in connection with FIGS. 16A and 16B. Then, at step 830, the timeout counter is cleared, at step 832 the slow loop counter is decremented, and at step 834 the process returns to the sequence illustrated in FIG. 14.

Figure 16A:
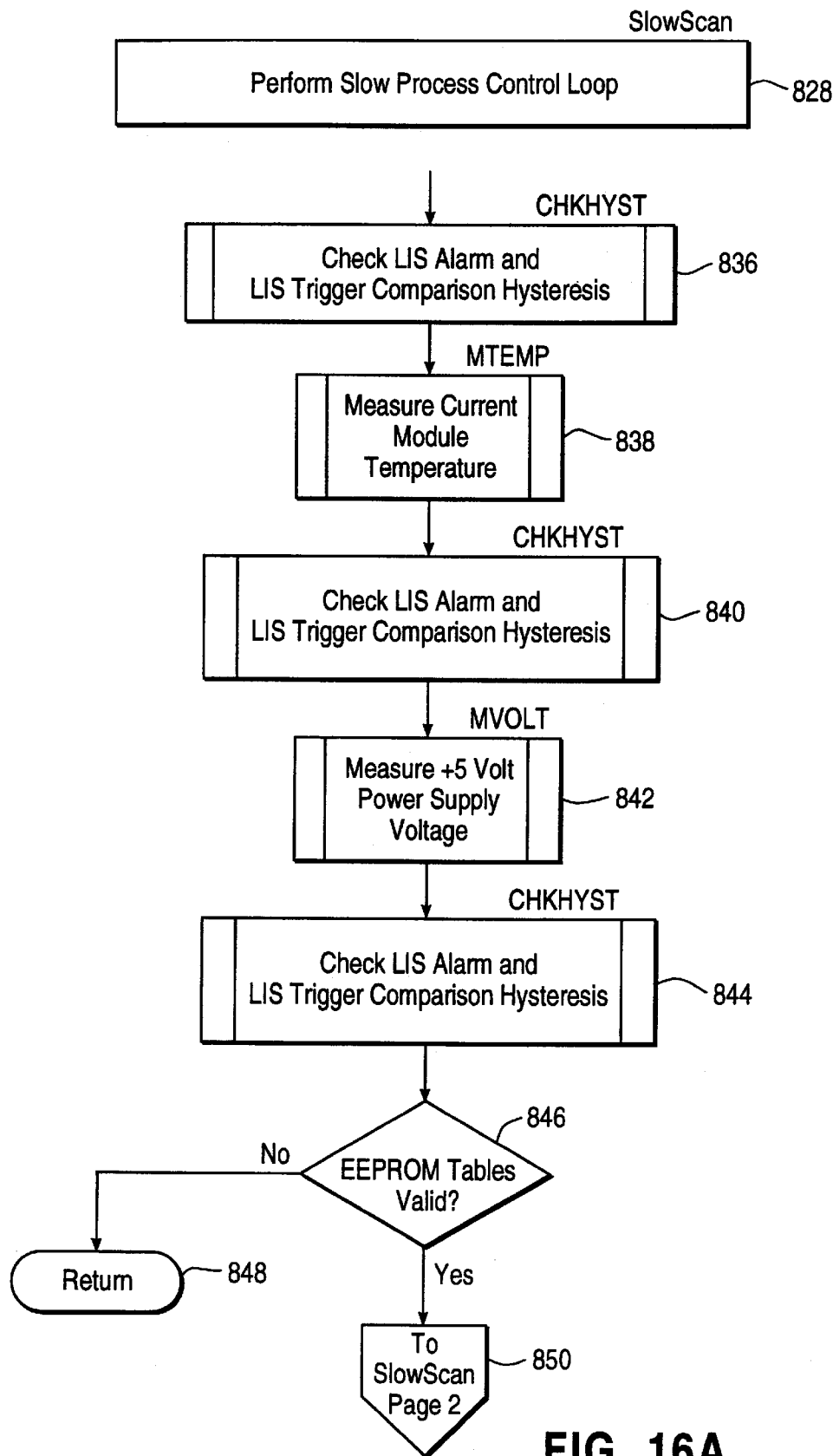
FIGS. 16A and 16B are flow charts illustrating a "slow process control loop" in accordance with embodiments of the present invention.
Figure 16B:
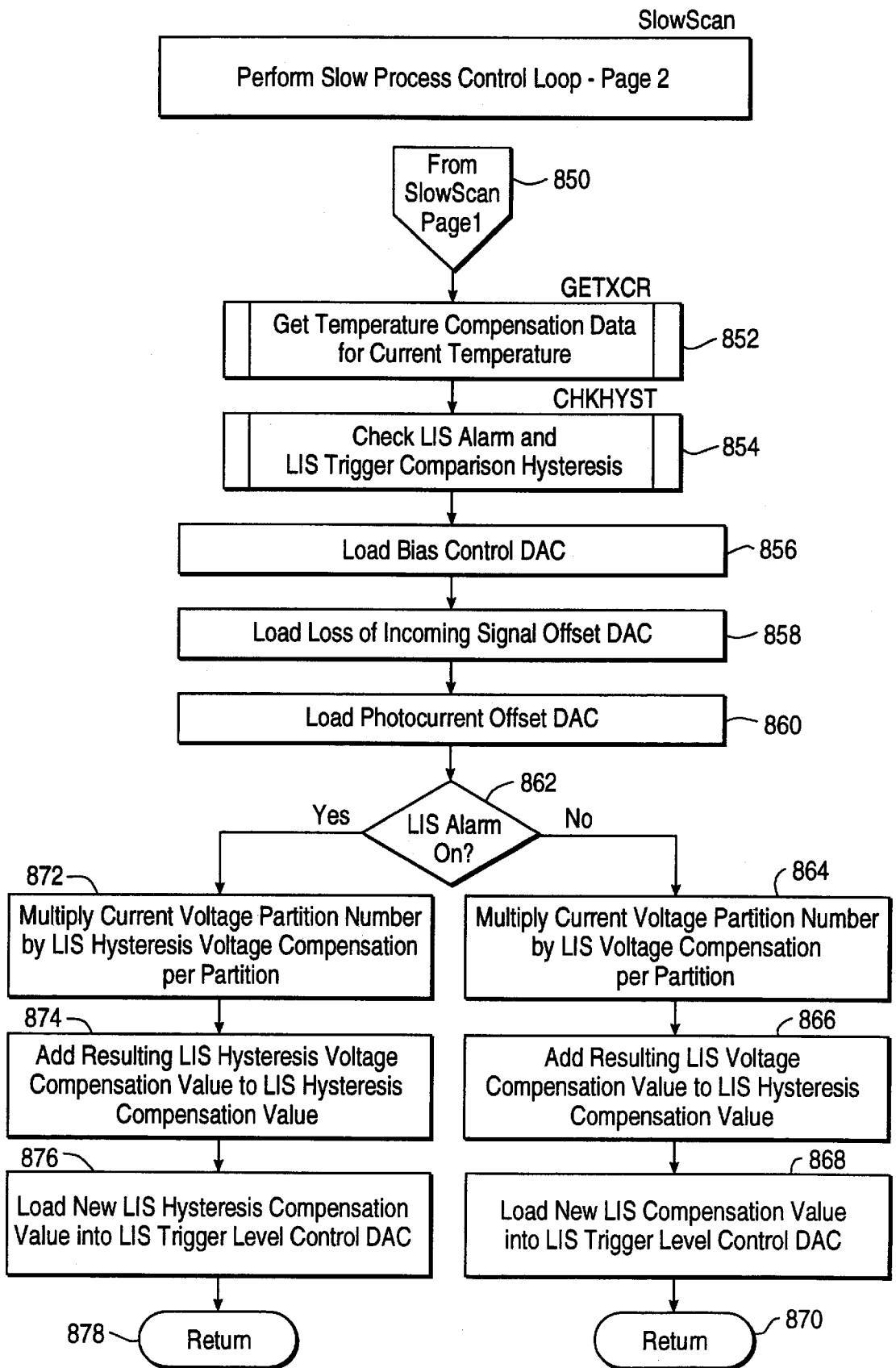

Referring now to FIGS. 16A and 16B, step 828 will be discussed in greater detail. At step 836, a process as discussed above in connection with step 824 is performed. At step 838, microcontroller 520 measures the current temperature of receiver module 500. At step 840, a process as discussed above in connection with step 824 is performed. At step 842, microcontroller 520 measures the power supply voltage level, which in the preferred embodiments is nominally +5 volts, and generates a voltage partition number corresponding to measured voltage levels in relation to the maximum and minimum power supply voltage level tolerances. At step 844, a process as discussed above in connection with step 824 is performed. At step 846, a determination is made as to whether the tables stored in non-volatile memory (or EEPROM, etc.) have been programmed with calibration data. If no, at step 848, the process returns to the sequence illustrated in FIG. 15. If yes, the process continues to step 852 of FIG. 16B, as illustrated by continuation marker 850.

At step 852, microcontroller 520 obtains from the non-volatile memory temperature compensation data for the current module temperature. At step 854, a process as discussed above in connection with step 824 is performed. At step 856, microcontroller 520 loads APD bias voltage adjust DAC 584 using data obtained from step 852. At step 858, microcontroller 520 loads loss of incoming signal peak amplitude offset adjust DAC 612 using data obtained from step 852. At step 860, microcontroller 520 loads photocurrent monitor offset DAC 606. At step 862, a determination is made as to whether the loss of incoming signal alarm is asserted. If no, then the process proceeds to step 864. If yes, the process proceeds to step 872.

At step 864, a current voltage partition number that was determined in step 842 is multiplied by the loss of incoming signal voltage compensation per partition. At step 866, the resulting loss of incoming signal voltage compensation value is added to the loss of incoming signal compensation value. At step 868, the new loss of incoming signal compensation value is loaded into loss of incoming signal compare control DAC 620. At step 870, the process returns to the sequence illustrated in FIG. 15.

In the event of loss of incoming signal alarm at step 862, steps 872, 874, 876 and 878 are performed, which parallel steps 864, 866, 868 and 870, with the exception that hysteresis values are computed and loaded into DAC 620 given that the loss of incoming signal alarm is asserted.

Referring again to FIG. 14, processing in the event of host request assertion (yes at step 808) will now be described. At step 810, an acknowledgment is sent to the host computer. At step 812, a command character is retrieved from the host. At step 814, a determination is made as to whether the host request is still asserted. If no, the process returns to step 806. If yes, the process proceeds to step 816, during which the host command character is processed.

Figure 17:
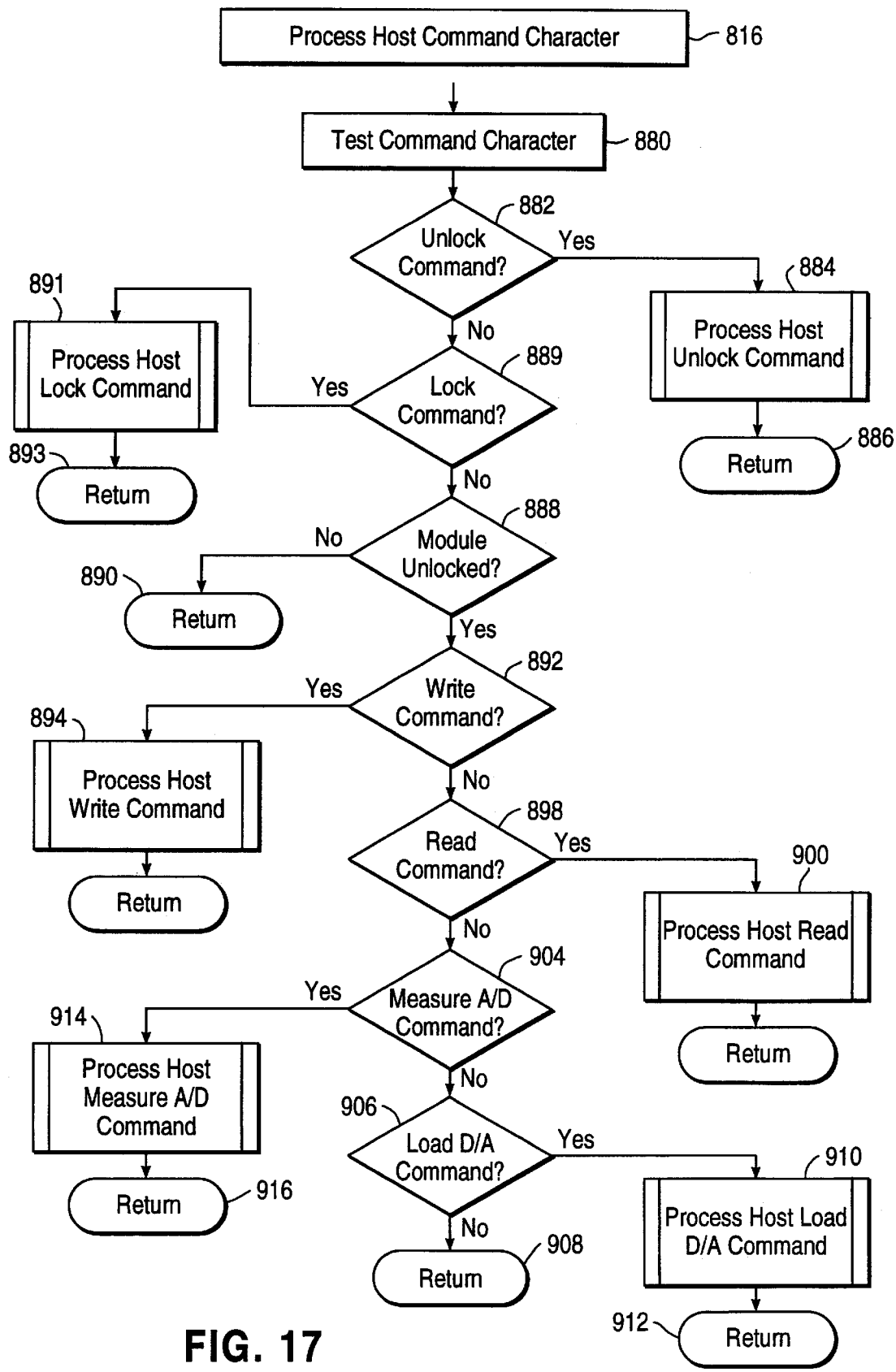
FIG. 17 is a flow chart illustrating a sequence for processing host command characters in accordance with embodiments of the present invention.

Step 816 is described in greater detail in connection with FIG. 17. At step 880, the command character received from the host is tested. If the command character is to unlock the receiver module, then the process proceeds to step 884, during which the module is unlocked, thereby enabling acceptance of further host commands, after which the process at step 886 returns to step 812 of FIG. 14. At step 889, it is determined whether the host command is a lock command. If yes, at step 892 the command is processed and the module is locked again, after which the process at step 893 returns to step 812 of FIG. 14. At step 888, if the module is not unlocked, then the process at step 890 returns to step 812 of FIG. 14. It should be noted that, with such an unlock command structure, an effective "password" control system may be implemented, thereby helping to prevent unauthorized alteration or host control of receiver modules 500. Additionally, the general command words and signaling protocol for host commands to the receiver module effectively provide an additional layer of security in that unauthorized users typically would be unable to properly provide commands of the correct structure and protocol. Such a "password" and protocol/command structure effectively allows receiver modules in accordance with the present invention to have a "dual" firewall or security structure.

At step 892, it is determined whether the host command is a write command. If the command character is a write command for writing to the non-volatile memory, then the process proceeds to step 894, during which the write command is processed, after which the process at step 896 returns to step 812 of FIG. 14.

At step 898, it is determined whether the host command is a read command. If the command character is a read command for reading from the non-volatile memory, then the process proceeds to step 900, during which the read command is processed, after which the process at step 902 returns to step 812 of FIG. 14.

At step 904, it is determined whether the host command is a measure ADC command. If the command character is a measure ADC command, then the process proceeds to step 914, during which the measure ADC command is processed, after which the process at step 916 returns to step 812 of FIG. 14.

At step 906, it is determined whether the host command is a load DAC command. If the command character is a load DAC command, then the process proceeds to step 910, during which the load DAC command is processed, after which the process at step 908 returns to step 812 of FIG. 14.

What will be appreciated from the foregoing is that, in accordance with embodiments of the present invention, receiver modules having a high degree of adaptability and programmability are provided, as well as novel methods of manufacturing and operating such receiver modules Although various preferred embodiments of the present invention have been disclosed for illustrative purposes, those skilled in the art will appreciate that various modifications, additions and/or substitutions are possible

What is claimed is:

1. A fiberoptic receiver, comprising:

an optical-to electrical conversion element that receives optical pulses from a communications network;

a power supply that provides a voltage level for the receiver;

a bias circuit that applies bias to the optical-to-electrical conversion element, wherein the bias circuit comprises a first analog control loop that provides a fast response current limit for the optical-to-electrical conversion element in response to variations in the optical power of the received optical pulses, a second analog control loop that provides bias adjustment for the optical-to-electrical conversion element in response to variations in the optical power of the received optical pulses, and a digital control loop that provides digitally controlled bias adjustment for the optical-to-electrical conversion element in response to changes in at least one operating condition including aging, temperature, input power, and voltage level provided by the power supply.

2. A fiberoptic receiver for receiving optical pulses from a communications network, the receiver comprising:

an optical-to-electrical conversion element having at least one bias condition;

a gain circuit coupled to the optical-to-electrical conversion element, the gain circuit having at least one gain setting;

at least one sensor that monitors one or more operating conditions of the receiver and provides monitored values for the one or more operating conditions;

circuitry coupled to the at least one sensor, wherein the circuitry accesses one or more locations of a non-volatile memory, the locations corresponding to the monitored values and storing data indicative of settings of one or more operating parameters of the receiver, the one or more operating parameters include the at least one bias condition and the at least one gain setting; and circuitry that implements at least one control loop that adjusts selected ones of the operating parameters of the receiver in response to the data.

3. The receiver of claim 2, wherein the one or more operating conditions include temperature.

4. The receiver of claim 2, wherein the one or more operating conditions include a voltage provided by a power supply used to power the receiver.

5. The receiver of claim 2, further comprising:

a circuit that generates an average peak amplitude voltage corresponding to an optical power of the received optical pulses; and a circuit that compares the average peak amplitude voltage against a reference voltage and generates a loss-of-incoming-signal alarm whenever the average peak amplitude voltage falls below the reference voltage.

6. The receiver of claim 2, wherein the one or more operating parameters include a bias voltage applied to the optical-to-electrical conversion element.

7. The receiver of claim 2, wherein a value of the bias voltage is selected based on a signal to noise gain of the optical-to-electrical conversion element.

8. The receiver of claim 2, wherein the at least one bias condition of the optical-to-electrical conversion element includes a bias voltage, wherein the bias voltage is varied according to an optical power of the received optical pulses.

9. The receiver of claim 2, wherein each of the at least one control loop has a unique response time.

10. The receiver of claim 2, wherein the at least one gain setting of the gain circuit is adjusted, in part, according to an optical power of the received optical pulses.

11. A fiberoptic receiver for receiving optical pulses from a communications network, the receiver comprising:

an optical-to-electrical conversion element that draws a current that is a function of the optical power of the received pulses;

at least one sensor that monitors one or more conditions of an environment in which the receiver operates and that thereby obtains values for the one or more conditions;

circuitry that accesses one or more locations of a non-volatile memory, the locations corresponding to the values and storing data from which can be determined one or more parameters suitable for controlling the operation of the receiver when the monitored conditions have the values, said one or more parameters including a value of a bias voltage applied to the optical-to-electrical conversion element; and a first control loop that reduces the bias voltage applied to the optical-to-electrical conversion element whenever the current drawn by the optical-to-electrical conversion element exceeds a first activation current level, the first control loop having a first response time.

12. The receiver of claim 11, further comprising:

a second control loop that reduces the bias voltage applied to the optical-to-electrical conversion element whenever the current drawn by the optical-to-electrical conversion element exceeds a second activation current level, wherein the second control loop has a second response time that is longer than the first response time and the second activation current level is lower than the first activation current level.

13. The receiver of claim 11, wherein the receiver includes:

a circuit that generates an average peak amplitude voltage corresponding to the optical power of the received optical pulses; and a circuit that compares the average peak amplitude voltage against a reference voltage and generates a loss-of-incoming-signal alarm whenever the average peak amplitude voltage falls below the reference voltage.

14. The receiver of claim 11, wherein the value of the bias voltage represents a best bias voltage.

15. A fiberoptic receiver that receives optical pulses from a communications network, the receiver comprising:

an optical-to-electrical conversion element that draws a current whose magnitude is a function of the optical power of the received pulses and of a bias voltage applied to the conversion element; and a first control loop that reduces the bias voltage applied to the optical-to-electrical conversion element whenever the current drawn by the conversion element exceeds a first activation current level, the first control loop having a first response time.

16. The receiver of claim 15, further comprising:

a second control loop that reduces the bias voltage applied to the optical-to-electrical conversion element whenever the current drawn by the conversion element exceeds a second activation current level, wherein the second control loop has a second response time that is longer than the first response time and the second activation current level is lower than the first activation current level.

17. The receiver of claim 15, further comprising:

at least one sensor that monitors one or more conditions of an environment in which the receiver operates and that thereby provides values for the one or more conditions, wherein the bias voltage applied to the optical-to-electrical conversion element is adjusted in accordance with the values provided by the at least one sensor.

18. The receiver of claim 17, further comprising:

circuitry that accesses one or more locations of a non-volatile memory, the locations corresponding to the values and storing data from which can be determined one or more parameters suitable for controlling the operation of the receiver when the monitored conditions have the values, the one or more parameters including a value for the bias voltage applied to the optical-to-electrical conversion element.

19. The receiver of claim 15, further comprising:

a circuit that generates an average peak amplitude voltage corresponding to the optical power of the received pulses; and a circuit that compares the average peak amplitude voltage against a reference voltage and generates a loss-of-incoming-signal alarm whenever the average peak amplitude voltage falls below the reference voltage.

20. The receiver of claim 15, wherein the value of the bias voltage represents a best bias voltage.

21. A method of calibrating a fiberoptic receiver that comprises an optical-to-electrical conversion element receiving optical pulses from a communications network during normal operation of the receiver, a bias voltage being applied to the optical-to-electrical conversion element, the method comprising, for each particular environment in a set of environments in which the receiver could be deployed during normal operation, the steps of:

placing the receiver in the particular environment;

determining a best bias voltage parameter for the optical-to-electrical conversion element of the receiver when operated in the particular environment, the best bias voltage parameter being determined by the steps of for each particular voltage from a first set of voltages spanning a first voltage range by a first increment, setting the bias voltage to the particular voltage, transmitting known data to the receiver, and measuring an error rate for the receiver, determining a first voltage from the first set of voltages such that the measured error rate for the first voltage is smaller than the error rate measured for any other voltage from the first set of voltages, for each particular voltage from a second set of voltages spanning a second voltage range that is smaller than the first voltage range by a second increment that is smaller than the first increment, setting the bias voltage to the particular voltage, transmitting known data to the receiver, and measuring an error rate for the receiver, the second voltage range being substantially centered around the first voltage, and determining that the best bias voltage parameter for the conversion element when operated in the particular environment is a second voltage from the second set of voltages, wherein the measured error rate for the second voltage from the second set of voltages is smaller than the error rate measured for any other voltage from the second set of voltages; and storing the best bias voltage parameter in a memory at a location corresponding to the particular environment, wherein during normal operation of the receiver in an operating environment the memory is accessed at one or more locations corresponding to the operating environment in order to obtain data from which the best bias voltage parameter of the receiver when operated in the operating environment can be determined.

22. The method of claim 21, wherein the set of environments spans a range of temperatures.

23. The method of claim 21, wherein the set of environments spans a range of values for a voltage output by a power supply used to power the receiver.

24. The method of claim 21, wherein:

the receiver includes a circuit for generating an average peak amplitude voltage corresponding to the optical power of the received pulses, and a circuit for comparing the average peak amplitude voltage against a reference voltage and for generating a loss-of-incoming-signal alarm whenever the average peak amplitude voltage falls below the reference voltage; and the method further includes the steps of determining a loss-of-incoming-signal alarm reference voltage parameter of the receiver when operated in the particular environment, and storing the loss-of-incoming-signal alarm reference voltage parameter in the memory at a location corresponding to the particular environment.

25. The method of claim 21, wherein:

the optical-to-electrical conversion element has a break down voltage; and the second range starts at a predetermined fraction of the break down voltage and stops at the break down voltage.

* * * * *